United States Patent
Schuster et al.

(10) Patent No.: US 12,283,740 B2
(45) Date of Patent: Apr. 22, 2025

(54) NON-LINEAR PARAMETRIC DEVICE INCLUDING A SUPERCONDUCTIVE MILLIMETER-WAVE RESONATOR EXHIBITING NON-LINEAR KINETIC INDUCTANCE AND METHOD FOR NON-LINEAR WAVE GENERATION

(71) Applicant: THE UNIVERSITY OF CHICAGO, Chicago, IL (US)

(72) Inventors: David I. Schuster, Chicago, IL (US); Aziza Suleymanzade, Cambridge, MA (US); Jonathan Simon, Chicago, IL (US); Alexander Vladimir Anferov, Chicago, IL (US)

(73) Assignee: THE UNIVERSITY OF CHICAGO

( * ) Notice: Subject to any disclaimer, the term of this patent is extended or adjusted under 35 U.S.C. 154(b) by 700 days.

(21) Appl. No.: 17/435,565

(22) PCT Filed: Mar. 3, 2020

(86) PCT No.: PCT/US2020/020831
§ 371 (c)(1),
(2) Date: Sep. 1, 2021

(87) PCT Pub. No.: WO2020/180885
PCT Pub. Date: Sep. 10, 2020

(65) Prior Publication Data
US 2022/0131254 A1 Apr. 28, 2022

Related U.S. Application Data

(60) Provisional application No. 62/813,066, filed on Mar. 3, 2019.

(51) Int. Cl.
*H01P 7/00* (2006.01)
*G06N 10/20* (2022.01)
(Continued)

(52) U.S. Cl.
CPC ............... *H01P 7/00* (2013.01); *G06N 10/20* (2022.01); *H01P 1/203* (2013.01); *H01P 3/08* (2013.01); *H03F 7/02* (2013.01); *H03F 19/00* (2013.01)

(58) Field of Classification Search
CPC .......... H01P 1/203; H01P 5/028; H03F 19/00; H03F 7/02; G06N 10/40
(Continued)

(56) References Cited

U.S. PATENT DOCUMENTS 6,445,271 B1 9/2002 Johnson
8,259,376 B2 9/2012 Ham
(Continued)

OTHER PUBLICATIONS

Hailey-Dunsheath, et al., Optical Measurements of SuperSpec: A Millimeter-Wave On-Chip Spectrometer, J. Low Temp Phys, Jan. 23, 2014, 7 pages.
(Continued)

*Primary Examiner* — Benny T Lee
(74) *Attorney, Agent, or Firm* — Cozen O'Connor

(57) ABSTRACT

A nonlinear parametric device includes a planar substrate and a millimeter-wave resonator formed from superconductive material deposited on the planar substrate. When the resonator is cooled below a critical temperature, it exhibits nonlinear kinetic inductance that may be used to implement millimeter-wave nonlinear frequency generation and parametric amplification. Millimeter waves may be coupled into, and out of, the nonlinear parametric device with hollow rectangular electromagnetic waveguides. Niobium nitride is an excellent superconductive material for kinetic inductance due to its high intrinsic sheet inductance, a critical temperature that is higher than many other superconductive materials, and relatively low loss at millimeter-wave frequencies.

20 Claims, 21 Drawing Sheets

(51) Int. Cl.
*H01P 1/203* (2006.01)
*H01P 3/08* (2006.01)
*H03F 7/02* (2006.01)
*H03F 19/00* (2006.01)

(58) Field of Classification Search
USPC .............................................. 333/219.1, 99 S
See application file for complete search history.

(56) References Cited

U.S. PATENT DOCUMENTS

| | | |
|---|---|---|
| 2012/0098594 A1 | 4/2012 | Zmuidzinas |
| 2017/0085231 A1* | 3/2017 | Abdo ...................... H03F 15/00 |
| 2018/0232653 A1* | 8/2018 | Selvanayagam et al. ................... H01P 5/028 |
| 2019/0165240 A1* | 5/2019 | Brink et al. ............ H01P 5/028 |

OTHER PUBLICATIONS

Shearrow, et al., Atomic Layer Deposition of Titanium Nitride for Quantum Circuits, arXiv:1808.06009v2 [cond-mat.mes-hall], Aug. 24, 2018, 10 pages.
Samkharadze, et al., High Kinetic Inductance Superconducting Nanowire Resonators for Circuit QED in a Magnetic Field, arXiv:1511.01670v1 [donc-mat.mes-hall], Nov. 5, 2015, 10 pages.
PCT Application No. PCT/US2020/020831, International Preliminary Report on Patentability, dated Aug. 25, 2021, 7 pages.

* cited by examiner

NON-LINEAR PARAMETRIC DEVICE INCLUDING A SUPERCONDUCTIVE MILLIMETER-WAVE RESONATOR EXHIBITING NON-LINEAR KINETIC INDUCTANCE AND METHOD FOR NON-LINEAR WAVE GENERATION

RELATED APPLICATIONS

This application is a 35 U.S.C. § 371 filing of International Application No. PCT/US2020/020831, filed Mar. 3, 2020, which claims priority to U.S. Provisional Patent Application No. 62/813,066, filed Mar. 3, 2019 and titled "Accessing Nonlinearity in Superconducting Millimeter Coplanar Resonators." Each of these applications is incorporated herein by reference in its entirety.

STATEMENT REGARDING FEDERALLY SPONSORED RESEARCH OR DEVELOPMENT

This invention was made with government support under grant number W911NF-17-C-0024 awarded by the Army Research Office, and grant number DMR1420709 awarded by the National Science Foundation. The government has certain rights in the invention.

BACKGROUND

Materials and devices with nonlinear electromagnetic responses may be used for nonlinear frequency generation, frequency conversion, parametric amplification, and other processes. For example, a radio-frequency or microwave mixer may use the nonlinear response of diodes to convert two signals at two input frequencies into additional signals at frequencies equal to linear combinations of the two input frequencies (e.g., the sum or difference of the two input frequencies). Additional sources of nonlinearity that may be used for nonlinear processes include transistors biased near cutoff, inductors driven into saturation, and analog multipliers. In the infrared and optical regions of the electromagnetic spectrum, certain types of crystals exhibit high levels of nonlinearity, making them particularly useful for optical nonlinear processes.

SUMMARY OF THE EMBODIMENTS

For superconducting quantum circuits, the millimeter-wave region of the electromagnetic spectrum presents a fascinating frequency regime between microwaves and optics. Compared to lower frequencies (e.g., radio frequencies and microwaves below 30 GHz), millimeter waves cover a wider range of energies and offer lower sensitivity to thermal background noise due to higher photon energies. Many advances have been made refining microwave quantum devices, typically relying on ultra-low temperatures in the millikelvin range to reduce noise and quantum decoherence. Using millimeter-wave photons as building blocks for superconducting quantum devices offers transformative opportunities by allowing quantum experiments to be run at liquid helium-4 temperatures, allowing higher device power dissipation and enabling large-scale direct integration with semiconductor devices. Millimeter-wave quantum devices could also provide new routes for studying strong-coupling light-matter interactions in this frequency regime, and present new opportunities for quantum-limited frequency conversion and detection.

Realizing quantum systems in the millimeter range (i.e., 30-300 GHz) requires low-loss components, i.e., device materials with low absorption rates and resonators with long photon lifetimes. Furthermore, nonlinear interactions are needed, which for circuit quantum optics can be realized with four-wave-mixing Kerr terms in the Hamiltonian. One approach commonly used at microwave frequencies relies on aluminum Josephson junctions, which yield necessary four-wave mixing at low powers. However, to avoid breaking Cooper pairs with high-frequency photons, millimeter-wave devices must be fabricated with materials with relatively high superconducting critical temperatures ($T_c$). Higher $T_c$ junctions have been implemented as high-frequency mixers for millimeter-wave detection, and ongoing efforts are improving losses for quantum applications.

The present embodiments utilize kinetic inductance (KI) as an alternative source of Kerr nonlinearity in millimeter-wave electromagnetic resonators. Arising from the inertia of Cooper pairs in a superconductor, KI has gained recent interest for microwave quantum applications and has been successfully demonstrated for millimeter-wave detection. Niobium nitride (NbN) is an excellent material for KI due to its high intrinsic sheet inductance, a relatively high $T_c$ between 14 and 18 K, and low microwave loss. Among deposition methods, atomic layer deposition (ALD) offers conformal growth of NbN and promising avenues for realizing repeatable high KI devices on a wafer-scale. Other deposition methods that may be used include sputtering and electron-beam evaporation.

In some embodiments, a nonlinear parametric device includes a planar substrate and a resonator formed from superconductive material deposited on the planar substrate. The resonator is sized to resonate at a millimeter-wave frequency, and when cooled below a critical temperature, exhibits nonlinear kinetic inductance.

In other embodiments, a method for nonlinear frequency generation includes cooling a resonator below a critical temperature to exhibit nonlinear kinetic inductance. The resonator is formed from superconductive material deposited on a planar substrate, and is sized to resonate at a millimeter-wave frequency. The method also includes generating one or more outputted millimeter waves, via the nonlinear kinetic inductance, from one or more inputted millimeter waves coupled into the resonator.

DETAILED DESCRIPTION OF THE EMBODIMENTS

Figure 1:
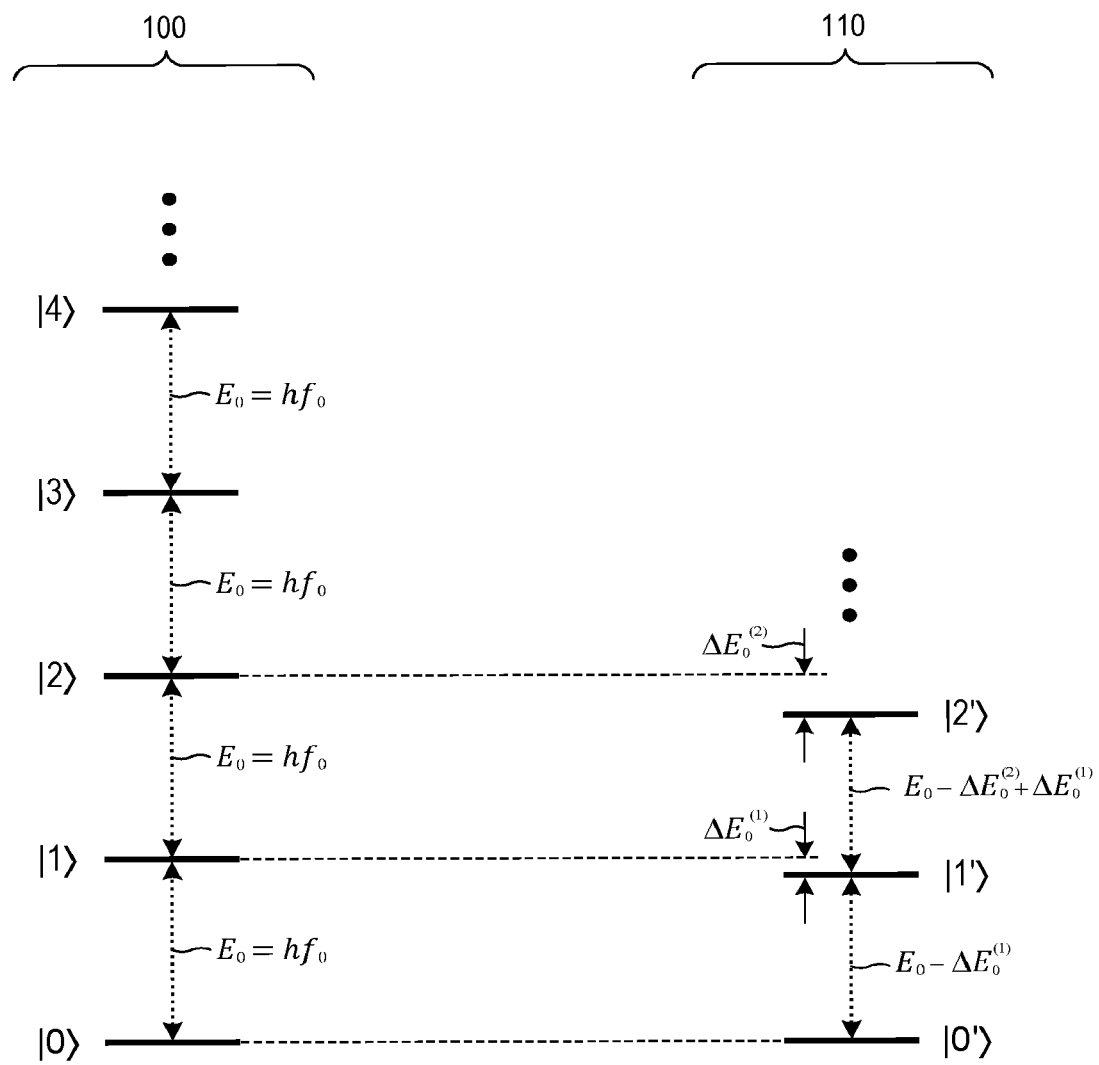
FIG. 1 shows an energy-level diagram of an electromagnetic resonator and an energy-level diagram of a nonlinear electromagnetic resonator.

FIG. 1 shows an energy-level diagram 100 of an electromagnetic resonator. Each energy level of the resonator is denoted $|n\rangle$, where n is a non-negative integer that indicates the number of photons exciting the fundamental mode of the resonator. In the example of FIG. 1, the ground state $|0\rangle$ has n=0 photons, a first excited state $|1\rangle$ has n=1 photons, a second excited state $|2\rangle$ has n=2 photons, a third excited state $|3\rangle$ has n=3 photons, and so on. As shown in FIG. 1, the energy levels $|n\rangle$ of the fundamental mode form a ladder of energy levels that are equally spaced by an energy spacing $E_0 = hf_0$, where h is Planck's constant and $f_0$ is the fundamental frequency (i.e., the frequency of the fundamental mode of the resonator). Thus, each photon has the same nominal energy $hf_0$. While the energy-level diagram 100 only shows energy levels up to a fourth excited state $|4\rangle$, the resonator may have additional energy levels as part of the ladder, where each higher energy level has a corresponding greater number of photons resonating in the fundamental mode. For clarity in FIG. 1, the energy-level diagram 100 does not show energy levels corresponding to higher modes of the resonator (i.e., at resonant frequencies of $2hf_0$, $3hf_0$, and so on).

One challenge with using the electromagnetic resonator as a qubit is that no two of the resonator's energy levels can be used to approximate a two-level quantum system. To appreciate this challenge, consider the resonator to initially be in the ground state $|0\rangle$. When subsequently driven with an electromagnetic signal whose frequency is at, or near, $f_0$, the electromagnetic signal will coherently transfer the resonator from the ground state $|0\rangle$ into a linear superposition of the ground state $|0\rangle$ and the first excited state $|1\rangle$. Due to the ladder structure, the electromagnetic signal is also resonant with all transitions $|n\rangle \rightarrow |n\pm1\rangle$, and therefore will also drive a population of the first excited state $|1\rangle$ into the ground state $|0\rangle$ and the second excited state $|2\rangle$, a population of the second excited state $|2\rangle$ into the first excited state $|1\rangle$ and the third excited state $|3\rangle$, and so on. Once the electromagnetic signal is extinguished and no longer driving the resonator, the resonator will be in a superposition of several energy levels $|n\rangle$. That is, the resonator will not necessarily be in a Fock state (i.e., a state with a definite integer number of photons). Accordingly, any attempt to coherently control the resonator within a two-level subsystem of the energy-level diagram 100 (e.g. the states $|0\rangle$ and $|1\rangle$) can result in several other energy levels outside of the two-level subsystem becoming populated. This loss of population to energy levels outside of the two-level subsystem can significantly degrade fidelity of a quantum computational process implemented with the two-level subsystem.

FIG. 1 also shows an energy-level diagram 110 of a nonlinear electromagnetic resonator that advantageously combines the "bare" electromagnetic resonator described by the energy-level diagram 100 with a nonlinearity that shifts the energy of each state $|n\rangle$ by a different amount. In this case, the nonlinearity is a Kerr nonlinearity in which the energy shift of a state $|n\rangle$ is proportional to $n^2$. Thus, the ground state $|0''\rangle$ of the nonlinear resonator and the ground state $|0\rangle$ of the bare resonator have the same energy. The nonlinear resonator has a first excited state $|1'\rangle$ whose energy is shifted from that of the corresponding first excited state $|1\rangle$ by a first nonlinear energy shift $\Delta E_0^{(1)}$. Accordingly, the transition $|0''\rangle \rightarrow |1'\rangle$ has an energy spacing of $E_0 - \Delta E_0^{(1)}$. The nonlinear resonator also has a second excited state $|2'\rangle$ whose energy is shifted from that of the corresponding second excited state $|2\rangle$ by a second nonlinear energy shift $\Delta E_0^{(2)}$ that is greater than $\Delta E_0^{(1)}$. Accordingly, the transition $|1'\rangle \rightarrow |2'\rangle$ has an energy spacing of $E_0 - \Delta E_0^{(2)} + \Delta E_0^{(1)}$. Although not shown in FIG. 1, the nonlinear resonator may have additional higher-energy excited states $|n'\rangle$, each with an energy that is shifted from that of the corresponding state $|n\rangle$ by an $n^{th}$ nonlinear energy shift $\Delta E_0^{(n)}$. Each transition $|n'\rangle \rightarrow |(n+1)'\rangle$ has an energy spacing of $E_0 - \Delta E_0^{(n+1)} + \Delta E_0^{(n)}$. Similar to the energy-level diagram 100, the energy-level diagram 110 only shows excitations of the fundamental mode of the nonlinear resonator.

The nonlinear energy shifts shown in the energy-level diagram 110 advantageously remove the ladder structure of the energy-level diagram 100. As a result, an electromagnetic signal resonantly driving the nonlinear resonator between the states $|0'\rangle$ and $|1''\rangle$ will non-resonantly drive other nonlinear-resonator transitions (i.e., $|1'\rangle \rightarrow |2'\rangle$, $|2'\rangle \rightarrow |3''\rangle$, etc.). The two lowest states $|0''\rangle$ and $|1'\rangle$ of the nonlinear resonator form a two-level subsystem that is more weakly coupled to the higher energy levels $|n'\rangle$ as compared to the states $|0\rangle$ and $|1\rangle$ of the bare resonator, and therefore better approximates an ideal two-level quantum system that is fully isolated from other energy levels. While the energy-level diagram 110 illustrates a Kerr nonlinearity, another type of nonlinearity may be used to remove the ladder structure of the energy-level diagram 100.

Figure 2:
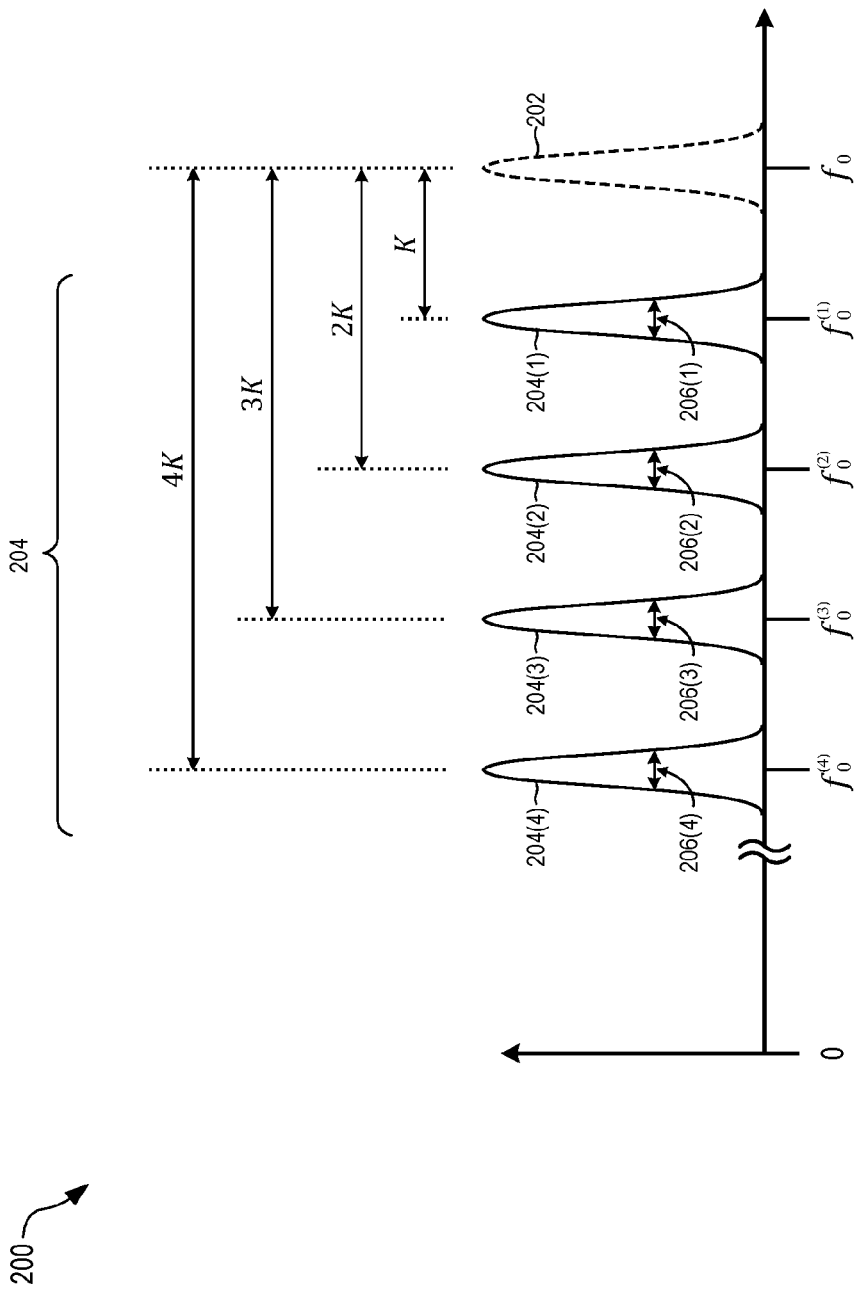
FIG. 2 shows a spectrum of the energy levels of the nonlinear electromagnetic resonator.

FIG. 2 shows a spectrum 200 corresponding to the energy levels of the nonlinear electromagnetic resonator. The spectrum 200 contains a plurality of resonances 204. While FIG. 2 shows, for clarity, only a first resonance 204(1) with a first transition frequency $f_0^{(1)}$, a second resonance 204(2) with a second transition frequency $f_0^{(2)}$, a third resonance 204(3) with a third transition frequency $f_0^{(3)}$, and a fourth resonance 204(4) with a fourth transition frequency $f_0^{(4)}$, it should be understood that there may be more than four of the resonances 204. Each resonance 204(n) has a respective linewidth 206(n), where n is an index that runs from 1 to a number of the resonances 204 (e.g., the first resonance 204(1) has a first linewidth 206(1), the second resonance 204(2) has a second linewidth 206(2), the third resonance 204(3) has a third linewidth 206(3), the fourth resonance

204(4) has a fourth linewidth 206(4), and so on). Each linewidth 206(n) is shaped as a Lorentzian and shown in FIG. 2 as a full-width at half maximum. Each resonance 204(n) has a quality factor Q that is equal to the ratio of the corresponding transition frequency $f_0^{(n)}$ to the corresponding linewidth 206(n). In the absence of nonlinearity (i.e., K=0), each resonance 204(n) would coincide with a "bare" resonance 202 centered at the resonant frequency $f_0$ of the fundamental mode of the bare resonator. Each resonance 204(n) in FIG. 2 corresponds to the transition $|0'\rangle \rightarrow |n''\rangle$, which has a transition frequency of $nf_0 - \Delta f_0^{(n)} = nf_0 - Kn^2$, K being the self-Kerr constant. Since each resonance 204(n) is driven with n photons of the same frequency, each resonance 204(n) will therefore occur at the transition frequency $f_0^{(n)} = (nf_0 - Kn^2)/n = f_0 - Kn$, i.e., the resonance 204(n) is shifted from $f_0$ by an amount proportional to n (e.g. K, 2K, 3K, 4K). While FIGS. 1 and 2 show the corresponding transition frequencies $f_0^{(n)}$ as decreasing with n, the nonlinear resonator may alternatively be configured such that the transition frequencies $f_0^{(n)}$ increase with n. Furthermore, due to the Kerr nonlinearity, the lineshape of each resonance 204(n) will be increasingly distorted for large values of n (see FIGS. 11A and 13C).

FIG. 2 illustrates two approaches to further isolate the two-level subsystem from the other excited states $|n'\rangle$. The first approach is to increase the nonlinear energy shifts $\Delta E_0^{(n)}$, which advantageously increases the frequency span between a resonance 204(n) and its neighbor resonances 204(n±1). With this first approach, an electromagnetic signal resonant with the $|0'\rangle \rightarrow |1'\rangle$ transition will become further detuned all other transitions, thereby decreasing the coupling from the state $|1'\rangle$ to the higher-energy states $|n'\rangle$. The second approach is to make the quality factor higher (i.e., to "narrow" each resonances 204(n) by reducing the linewidths 206(n)), which also decreases coupling from the $|1'\rangle$ to the higher-energy states $|n'\rangle$. Although the millimeter-wave resonators described herein can achieve internal Qs of 80,000, or more, the present embodiments address the challenge of increasing nonlinearity in superconducting millimeter-wave resonators.

Figure 3:
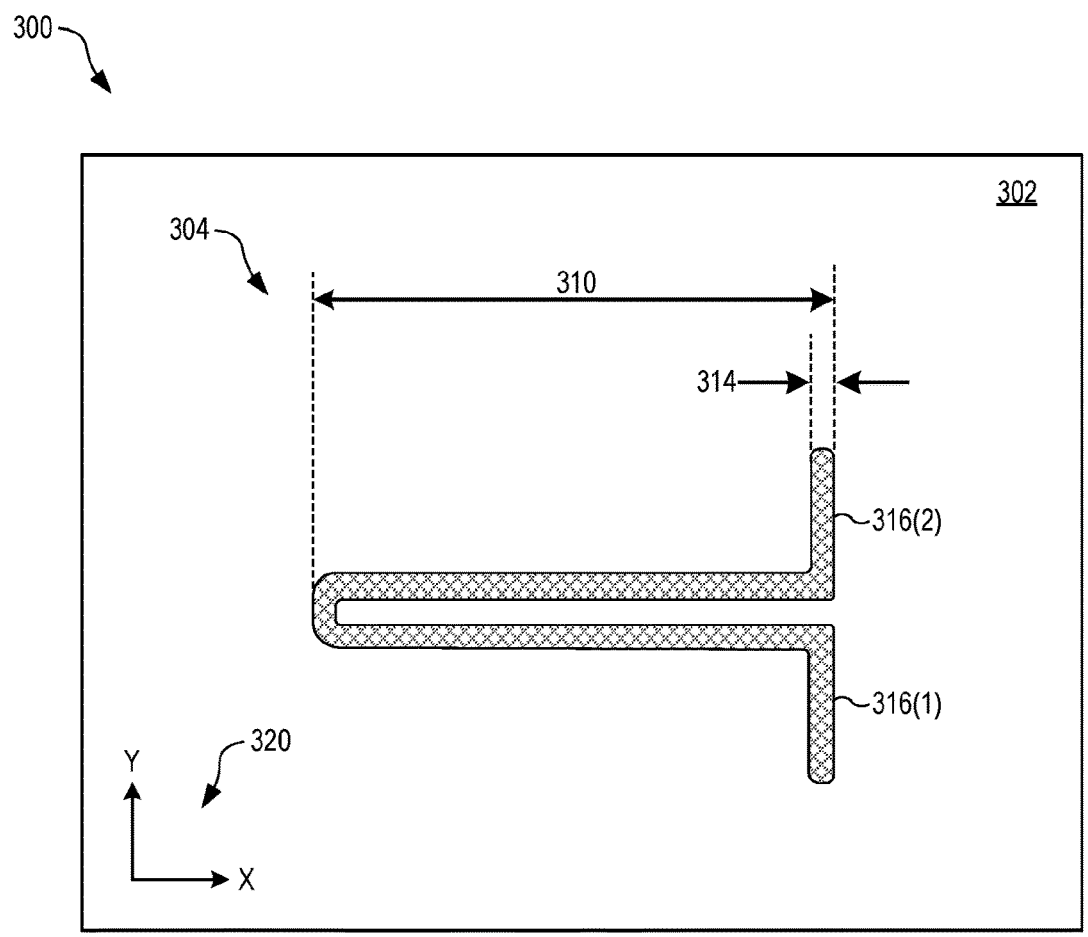
FIG. 3 is a top view of a nonlinear parametric device formed from a millimeter-wave resonator deposited on a planar substrate, in an embodiment.

FIG. 3 is a top view of a nonlinear parametric device 300 formed from a millimeter-wave resonator 304 deposited on a planar substrate 302. The millimeter-wave resonator 304 is formed from superconductive material deposited onto a top surface of the planar substrate 302. Advantageously, when the nonlinear parametric device 300 is cryogenically cooled below a critical temperature $T_c$, the millimeter-wave resonator 304 superconducts, exhibiting kinetic inductance of the form $L = L_k + \Delta L_k I^2/I_c^2$, where $L_k$ is the linear kinetic inductance, $\Delta L_k$ is the nonlinear kinetic inductance, $I_c$ is the critical current, and I is the current flowing in the millimeter-wave resonator 304. The nonlinear kinetic inductance $\Delta L_k$ adds fourth-order nonlinear terms of the form $(\hbar/2)K(\alpha^\dagger\alpha)^2$ to the Hamiltonian of the millimeter-wave resonator 304, where $K \propto \omega_0^2 \Delta L_k / I_c^2$ is the self-Kerr constant. As shown in FIG. 2, these nonlinear terms shift the fundamental frequency spacing $\omega_0 = 2\pi f_0$ of the "bare resonator" (i.e., the eigenfrequency of the Hamiltonian without the nonlinear terms) by K for each photon exciting the millimeter-wave resonator 304.

One aspect of the present embodiments is the realization that the nonlinear kinetic inductance $\Delta L_k$ scales as the $\omega_0^2$, and therefore a millimeter-wave resonator 304 with a fundamental frequency of $\omega_0 = (2\pi) \times 100$ GHz will exhibit a 100-fold greater nonlinearity than a microwave resonator with a fundamental frequency of $\omega_0 = (2\pi) \times 10$ GHz. Another motivation for increasing the fundamental frequency into the millimeter-wave regime is to move the frequency of the two-state subsystem transition away from the peak of the blackbody spectrum in cryogenic systems, which advantageously reduces the cooling requirements when using the millimeter-wave resonator 304 as a superconducting qubit.

In the example resonator 304 of FIG. 3, the superconductive material forms a single trace shaped as a shorted quarter-wave transmission line. The transmission line may be implemented as a balanced coplanar stripline waveguide, as shown in the example of FIG. 3, or with another type of planar electrical transmission line known in the art (e.g., microstrip, slotline, finline, etc.). One benefit of the balanced coplanar stripline waveguide shown in FIG. 3 is that the superconductive material only needs to be deposited on one surface of the planar substrate 302. Additional superconductive material can be deposited on the other surface (i.e., a bottom surface) of the planar substrate 302, if needed. However, a large ground plane deposited on the planar substrate 302 may shield the resonator 304 from millimeter waves. The resonator 304 may also include one or both of dipole antennas 316(1), 316(2) that are also formed from superconductive material deposited on the planar substrate 302, and electrically coupled to transmission line. Advantageously, the dipole antennas 316(1), 316(2) help couple electromagnetic waves into the quarter-wave transmission line.

Examples of superconductive materials that may be used to form the millimeter-wave resonator 304 include niobium (Nb), aluminum (Al), niobium nitride (NbN), titanium nitride (TiN), niobium titanium nitride (NbTiN), tantalum (Ta), and indium (In). One advantage of NbN is that its critical temperature $T_c \approx 13$ K is higher than that of Nb (9 K), Al (1 K), and TiN (4 K). Advantageously, a higher critical temperature $T_c$ reduces the cooling requirements needed to observe the onset of nonlinear kinetic inductance. However, another type of superconductive material may be used without departing from the scope hereof.

The planar substrate 302 may be formed from any material that acts as a dielectric medium for millimeter waves, and is compatible with cryogenic cooling. Examples of such materials include sapphire, quartz, fused silica, crystalline silicon, and silicon-on-insulator. Another material may be used for the planar substrate 302 without departing from the scope hereof. A thickness of the planar substrate 302 in the z direction (see the x axis and y axis of the right-handed coordinate system 320) may be less than 10 mm (e.g., 100 μm). While FIG. 3 shows the resonator 304 formed on a top surface (in the z direction) of the planar substrate 302, the resonator 304 may be alternatively formed on a bottom surface of the planar substrate that is parallel (i.e., opposite) to the top surface.

The superconductive material may be deposited onto the planar substrate 302 via atomic layer deposition, chemical vapor deposition, sputtering, electron-beam evaporation, or another thin-film deposition technique known in the art. A thickness of the single trace may be 50 nm or less. A width 314 of the single trace may be 200 μm or less. For example, the width 314 may be 4 μm.

A length 310 of the transmission line in the x direction (see right-handed coordinate system 320) is selected such that resonator 304 has a fundamental frequency wo in the millimeter-wave regime. More specifically, the length 310 is equal to one-fourth of the wavelength $\lambda_0$ corresponding to the fundamental frequency $\omega_0$, corrected for the dielectric constant (at cryogenic temperatures) of the material forming the planar substrate 302. For example, the length 310 is approximately 100 μm for $\omega_0 = (2\pi) \times 100$ GHz and a planar substrate 302 formed from sapphire (i.e., $\lambda_0 \approx 400$ µm). Alternatively, the length 310 may equal an integer multiple of $\lambda_0/4$ (i.e., $n\lambda_0/4$ where n is any positive integer). The planar substrate 302 may have a length in the x direction greater than the length 310 (e.g., 1 mm or more). Similarly, the planar substrate 302 may have a width in the y direction that is greater than a corresponding width of the resonator 304 (e.g., 1 mm or more). The internal quality factor of the resonator 304, also denoted herein as $Q_i$, may be 10,000 or higher (e.g., 80,000). Note that $Q_i$ represents only the intrinsic quality factor of the resonator 304, and therefore excludes the effects of coupling to the resonator 304. With coupling included, the effective quality factor of the resonator 304 tends to be less than $Q_i$.

Figure 4:
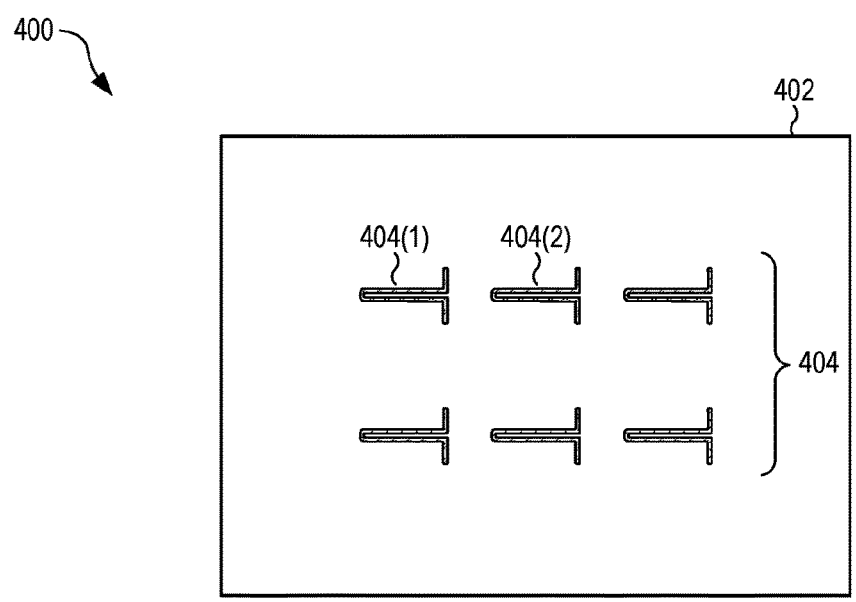
FIG. 4 is a top view of a nonlinear parametric device that is similar to the nonlinear parametric device of FIG. 3 except that the nonlinear parametric device of FIG. 4 includes a plurality of millimeter-wave resonators deposited onto a planar substrate, in an embodiment.

FIG. 4 is a top view of a nonlinear parametric device 400 that is similar to the nonlinear parametric device 300 of FIG. 3 except that the nonlinear parametric device 400 of FIG. 4 includes a plurality of millimeter-wave resonators 404 deposited onto a planar substrate 402. For clarity, only a first millimeter-wave resonator 404(1) and a second millimeter-wave resonator 404(2) of the plurality of millimeter-wave resonators 404 are labeled in FIG. 4. While the nonlinear parametric device 400 is shown in FIG. 4 with six millimeter-wave resonators 404, the nonlinear parametric device 400 may have any number of millimeter-wave resonators 404. The millimeter-wave resonators 404 may be configured to resonate at different fundamental frequencies wo, advantageously allowing several nonlinear frequencies to be generated with the one planar substrate 402.

Figure 5:
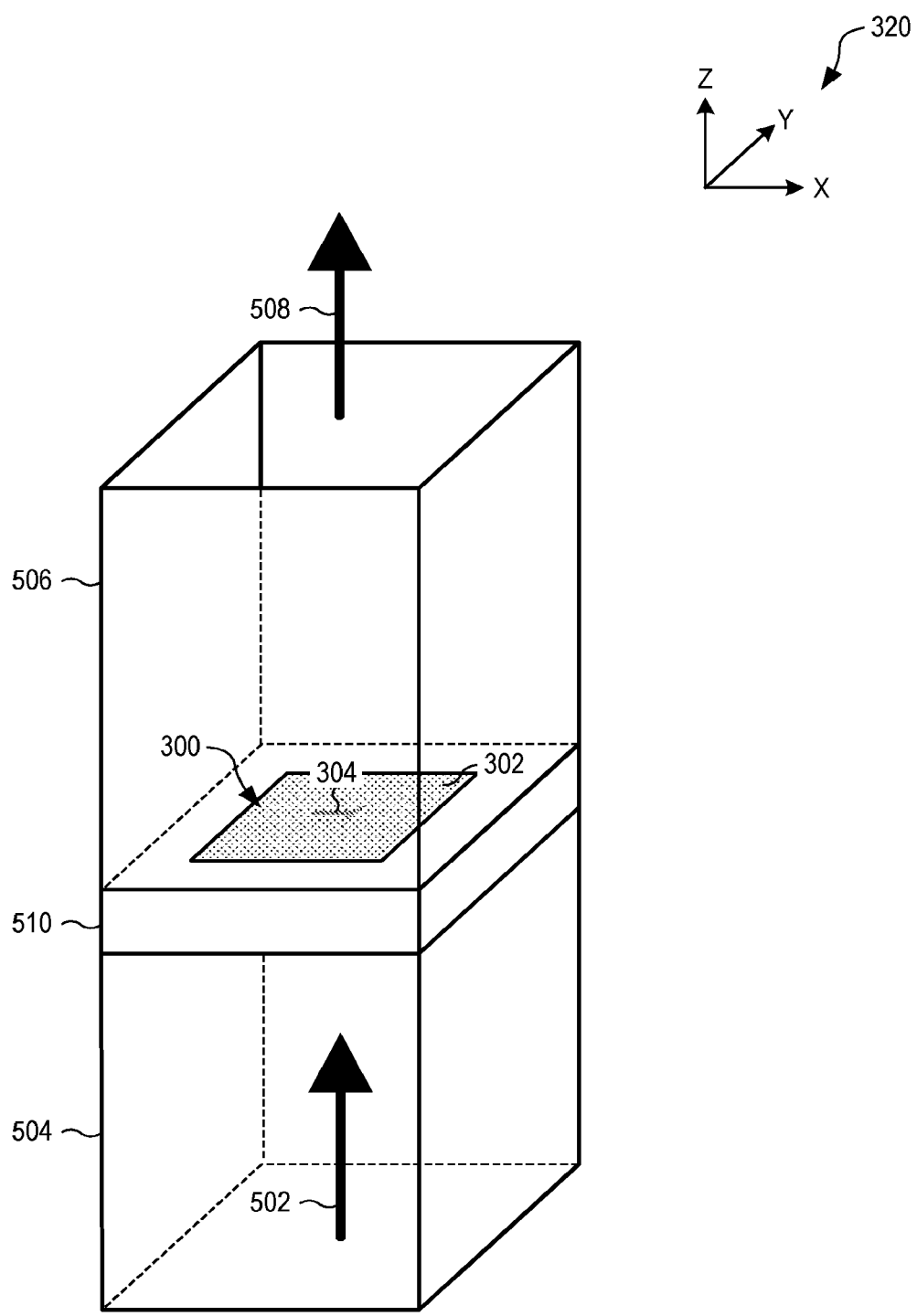
FIG. 5 is a perspective view of the nonlinear parametric device of FIG. 3, illustrating how one or more inputted millimeter waves may be coupled into the millimeter-wave resonator via an input waveguide, in an embodiment.

FIG. 5 is a perspective view of the nonlinear parametric device 300 of FIG. 3, illustrating how one or more inputted millimeter waves 502 may be coupled into the millimeter-wave resonator 304 via an input waveguide 504. FIG. 5 also shows how one or more outputted millimeter waves 508 may be coupled out of the resonator 304 via an output waveguide 506. One end of the input waveguide 504 abuts the nonlinear parametric device 300 (e.g., at the bottom surface of the planar substrate 302) such that the one or more inputted millimeter waves 502, after propagating along the input waveguide 504, couple into the planar substrate 302 of the nonlinear parametric device 300. One end of the output waveguide 506 also abuts the nonlinear parametric device 300 (e.g., at the top surface of the planar substrate 302) such that the one or more outputted millimeter waves 508 couple into the output waveguide 506.

The nonlinear parametric device 300 is mounted into a copper block 510 with a clear aperture (not shown) such that the inputted millimeter waves 502 can directly couple into the nonlinear parametric device 300, and such that the outputted millimeter waves 508 can directly couple out of the nonlinear parametric device 300. The copper block 510 also provide good electrical connectivity between the walls of the input waveguide 504 and the output waveguide 506. More details about how the copper block 510, the input waveguide 504, and the output waveguide 506 are provided below (see FIGS. 8a and 12).

In FIG. 5, the nonlinear parametric device 300 lies in the x-y plane of the coordinate system 320. In this configuration, the inputted millimeter waves 502 and the outputted millimeter waves 508 propagate along the z direction. Each of the input waveguide 504 and the output waveguide 506 is shown in FIG. 5 as a hollow rectangular waveguide along which electromagnetic waves propagate in the $TE_{01}$ mode. However, another type of waveguide (e.g., cylindrical) may be used instead. While FIG. 5 shows the nonlinear parametric device 300 oriented with the resonator 304 facing upwards (in the z direction), the nonlinear parametric device 300 may be alternatively oriented "upside down" with the resonator 304 facing downward.

When the nonlinear parametric device 300 is cooled below the critical temperature of the resonator 304, the nonlinear parametric device 300 exhibits nonlinear kinetic inductance. Under this condition, the nonlinear parametric device 300 generates the one or more outputted millimeter waves 508 from the one or more inputted millimeter waves 502. Due to the nonlinear kinetic inductance, the nonlinear parametric device 300 can be used to implement any fourth-order nonlinear process, such as parametric amplification and four-wave mixing. More details about these nonlinear frequency processes are presented below.

Figure 6:
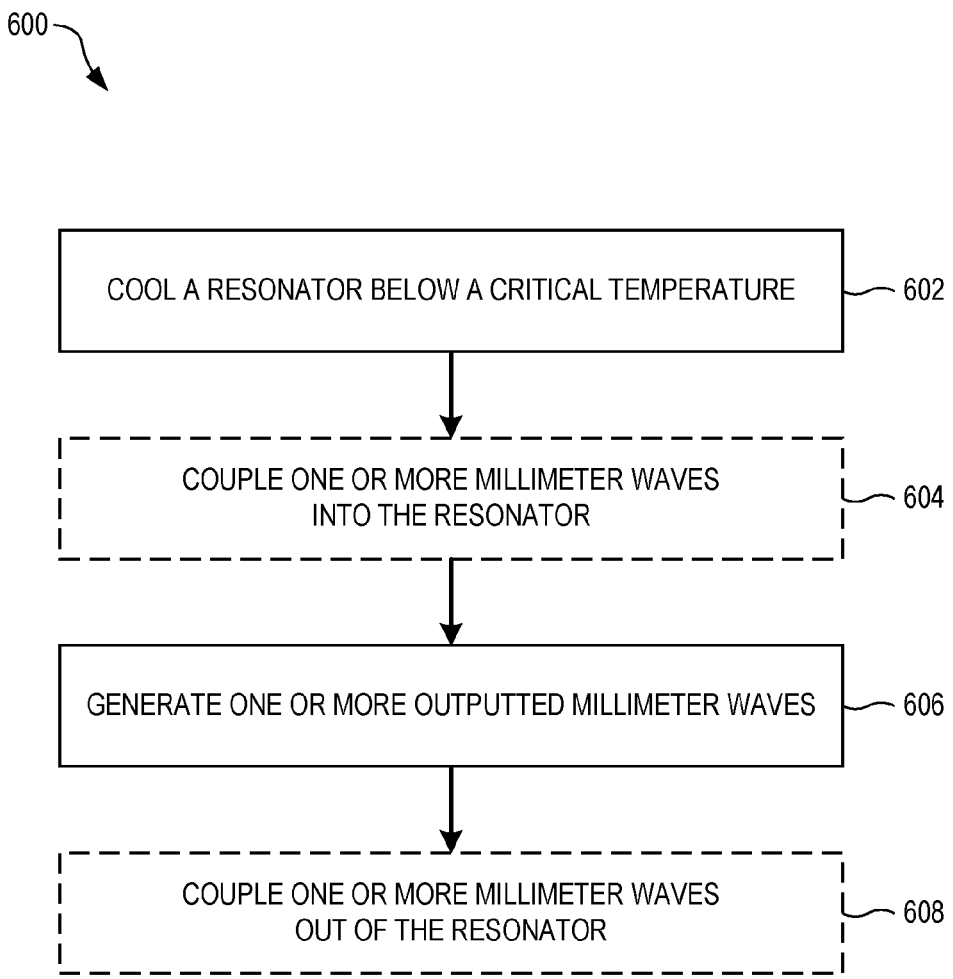
FIG. 6 is a flow chart of a method for nonlinear frequency generation, in embodiments.

FIG. 6 is a flow chart of a method 600 for nonlinear frequency generation. The method 600 may be implemented with the nonlinear parametric device 300 of FIG. 3. In a block 602 of the method 600, a resonator is cooled below a critical temperature to exhibit nonlinear kinetic inductance. The resonator is formed from superconductive material deposited on a planar substrate, and is sized to resonant at a millimeter-wave frequency. In one example of the block 602, the nonlinear parametric device 300 of FIG. 3 is cooled below the critical temperature $T_c$ of the millimeter-wave resonator 304 such that the millimeter-wave resonator 304 exhibits nonlinear kinetic inductive $\Delta L_k$.

In a block 606 of the method 600, one or more outputted millimeter waves are generated, via the nonlinear kinetic inductance, from one or more inputted millimeter waves coupled into the resonator. In one example of the block 606, the one or more outputted millimeter waves 508 are generated from the one or more inputted millimeter waves 502 (see FIG. 5).

In some embodiments, the method 600 includes a block 604 in which the one or more inputted millimeter waves are coupled into the resonator. The block 604 may occur simultaneously with one or both of the blocks 602 and 604. In one example of the block 604, the one or more inputted millimeter waves 502 are coupled into the nonlinear parametric device 300. Furthermore, the method 600 may also include a block 608 in which the one or more outputted millimeter waves are coupled out of the resonator. The block 608 may occur simultaneously with one or more of the blocks 602, 604, and 606. In one example of the block 608, the one or more outputted millimeter waves 508 are coupled out of the nonlinear parametric device 300.

In some embodiments, the method 600 implements parametric amplification. Specifically, the one or more inputted millimeter waves include a pump and a signal, and the one or more outputted millimeter waves include an amplified signal and an idler. In the block 606 of these embodiments, the signal is parametrically amplified into the amplified signal by transferring energy from the pump into the signal, and by emitting the idler. Thus, the amplified signal and the signal have the same signal frequency, the pump has a pump frequency greater than the signal frequency, and the idler has an idler frequency less than the pump frequency.

In some embodiments, the method 600 implements four-wave mixing. Specifically, the one or more inputted millimeter waves include a first input wave at a first frequency $f_1$, a second input wave at a second frequency $f_2$ different from the first frequency $f_1$, and a third input wave having a third frequency $f_3$ different from each of the first frequency $f_1$ and the second frequency $f_2$. Furthermore, the one or more outputted millimeter waves include an output wave at an output frequency equal to at least one of $\pm f_1 \pm f_2 \pm f_3$. In the block 606 of these embodiments, the output wave is generated via four-wave mixing of the first, second, and third input waves.

In some embodiments, the method 600 implements degenerate four-wave mixing. Specifically, the one or more inputted millimeter waves include a first input wave at a first frequency $f_1$ and a second input wave at a second frequency $f_2$ different from the first frequency $f_1$. Furthermore, the one or more outputted millimeter waves include an output wave at an output frequency equal to $2f_1-f_2$. In the block 606 of these embodiments, the output wave is generated via degenerate four-wave mixing of the first and second input waves.

In the block 604 of some embodiments of the method 600, the one or more inputted millimeter waves are coupled into the resonator with an input waveguide abutting a first surface of the planar substrate such that the one or more inputted millimeter waves, after propagating along the input waveguide, couple into the planar substrate through the first surface. The resonator may be formed on the first surface. Alternatively, the resonator may be formed on a second surface, opposite the first surface, of the planar substrate. In one example of the block 604 of these embodiments, the input waveguide 504 couples the one or more inputted millimeter waves 502 into the bottom surface of the planar substrate 302 of the nonlinear parametric device 300 (see FIG. 5).

In the block 608 of some embodiments of the method 600, the one or more outputted millimeter waves are coupled out of the resonator with an output waveguide abutting the second surface of the planar substrate such that the one or more outputted millimeter waves couple into the output waveguide through the second surface. In one example of the block 608 of these embodiments, the output waveguide 506 couples the one or more outputted millimeter waves 508 out of the top surface of the planar substrate 302 of the nonlinear parametric device 300.

Figure 7:
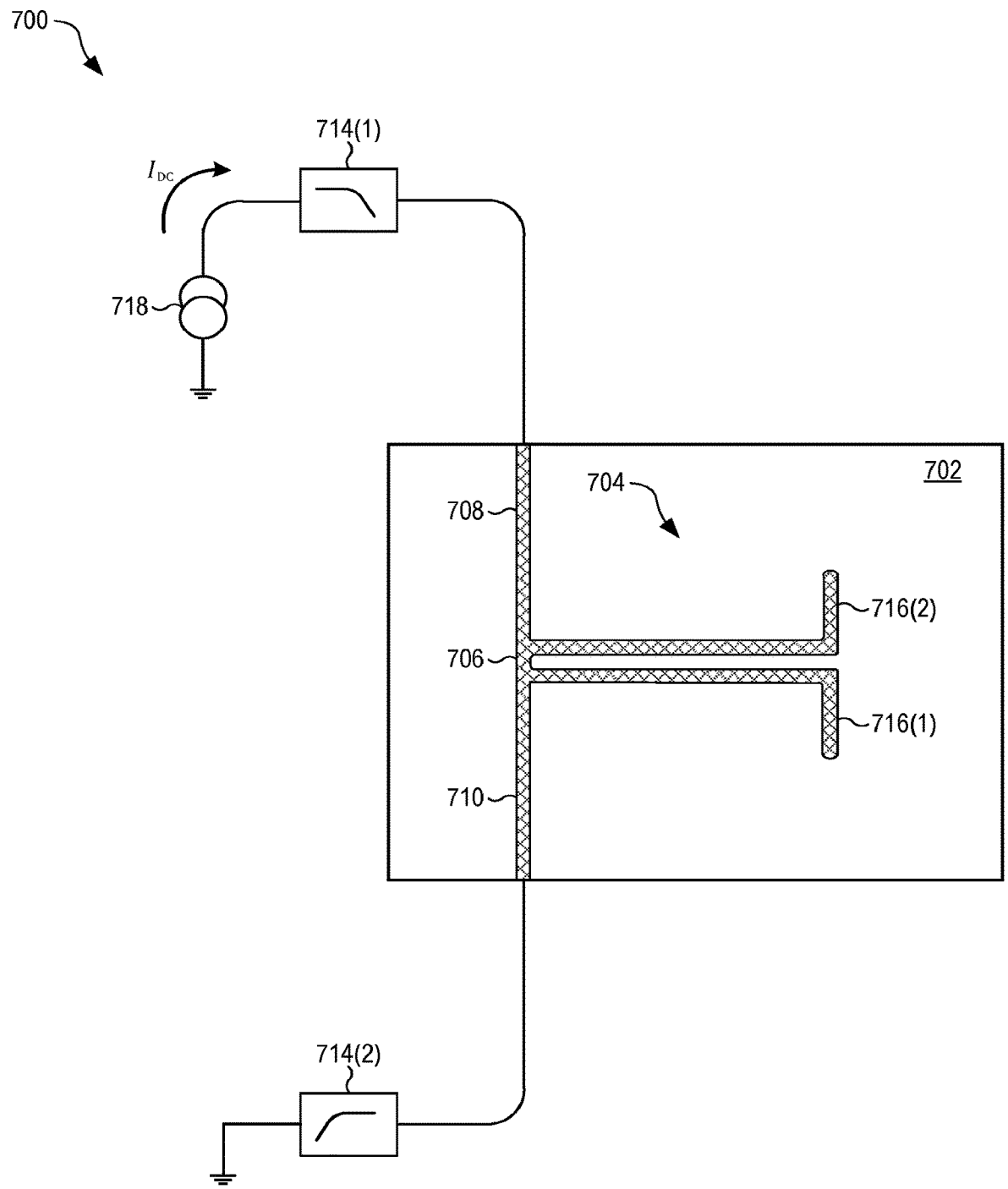
FIG. 7 shows a nonlinear parametric device that is similar to the nonlinear parametric device of FIG. 3 except that the nonlinear parametric device of FIG. 7 is configured for three-wave nonlinear mixing, in an embodiment.

FIG. 7 shows a nonlinear parametric device 700 that is similar to the nonlinear parametric device 300 of FIG. 3 except that the nonlinear parametric device 700 of FIG. 7 is configured for three-wave nonlinear mixing. The nonlinear parametric device 700 includes a millimeter-wave resonator 704 that is similar to the resonator 304 of FIG. 3 in that it is configured as a balanced quarter-wave coplanar stripline waveguide. The millimeter-wave resonator 704 is deposited on a planar substrate 702. The two striplines of the resonator 704 meet at a connection point 706 that is opposite to dipole antennas 716(1), 716(2). The connection point 706 is biased with a DC current $I_{DC}$ from a current source 718. A first low-pass filter 714(1) filters the current $I_{DC}$ before flowing into the connection point 706 via an input leg 708. The current $I_{DC}$ then flows out of the connection point 706 via an output leg 710, after which a second low-pass filter 714(2) filters $I_{DC}$ prior to returning to ground. The low-pass filters 714(1), 714(2) provide a high impedance to the resonator 704 at millimeter-wave frequencies, thereby preventing the Q of the resonator 704 from becoming degraded.

In some embodiments, any one or more of the resonators 304 (FIG. 3), 404 (FIG. 4), and 704 (FIG. 7) is used to upconvert thermal photons from a first frequency to a second frequency that is higher than the first frequency. At the second frequency, the thermal photons are easier to cool, thereby removing the thermal energy. As such, the present embodiments may be used enhance cooling of superconducting circuits.

In some embodiments, any one or more of the resonators 304, 404, and 704 is used as a superconducting-insulator-superconducting (SIS) Josephson junction or a weak-link Josephson junction.

In some embodiments, any one or more of the resonators 304, 404, and 704 is operated non-reciprocally, wherein one or more of the resonators 304, 404, and 704 may be used to construct a millimeter-wave isolator or circulator.

Device Measurement

Figure 8:
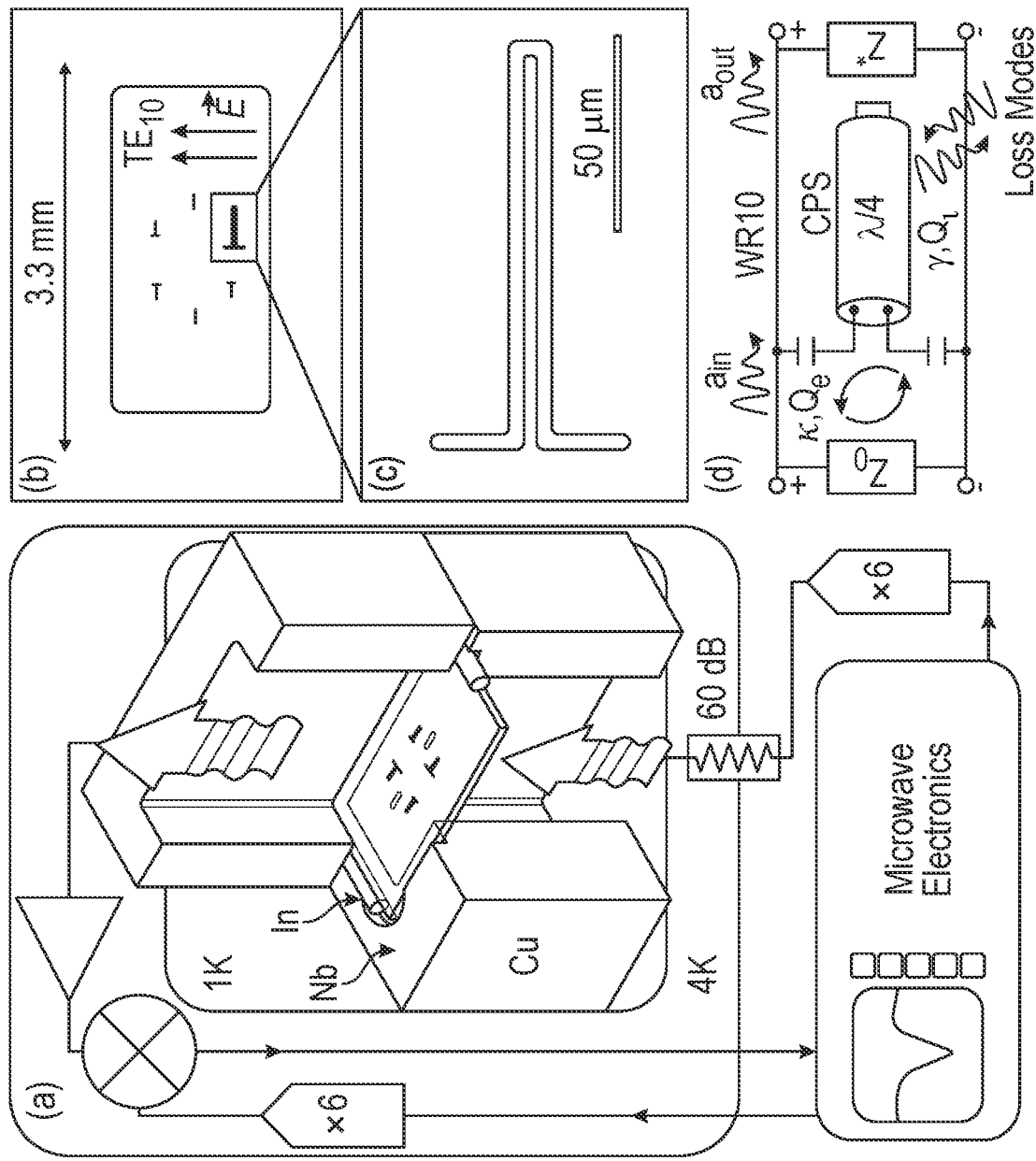
FIGS. 8A-8D illustrate device characterization and design, in embodiments.

FIGS. 8A, 8B, 8C, and 8D illustrate device characterization and design. Specifically, FIG. 8A shows six-fold frequency multipliers (labeled "x6" in FIG. 8A) converting microwave signals to millimeter-wave signals, which are demodulated with a cryogenic mixer. In FIG. 8A, a cutaway view shows copper (Cu) WR10 rectangular waveguides coupling the signal in and out of a slot coated with niobium (Nb), into which a chip patterned with six resonators is mounted. FIG. 8B is a top-down view showing a mounted chip with the top waveguide removed. FIG. 8C is a top-down view of a typical resonator used in this work, with wire width w=4 μm and film thickness t=27.8 nm. Dipole-coupling antennas extend on the left of the quarter-wave resonator. Measurements can be described with an external quality factor $Q_e$ (and corresponding input coupling rate κ) and an internal quality factor $Q_i$ (and corresponding loss coupling rate γ to loss modes) with use of the circuit model shown in FIG. 8D. This circuit model accounts for the impedance mismatch between the waveguide (whose impedance is $Z_0$) and the slot with a sapphire chip (whose impedance is Z*). In FIG. 8D, $a_{in}$ and $a_{out}$ indicate the input mode and output mode, respectively.

The inventors investigate properties of millimeter-wave high-KI resonators in the quantum regime (at a temperature of 1 K; see FIG. 8A) in a helium-4 adsorption refrigerator. Using a six-fold frequency multiplier, cryogenic mixer, and low-noise amplifier that operate at a temperature of 4 K, the inventors measure the complex transmission response, as shown in FIG. 8A (see "Microwave Electronics"). Input attenuation of 60 dB reduces thermal noise reaching the sample, enabling transmission measurements in the single-photon limit set by the thermal background. Rectangular waveguides couple the signal in and out of a 200-μm-deep slot, the dimensions of the slot being carefully selected to shift spurious lossy resonances out of the W band. To reduce potential conductivity losses, the waveguide and the slot are coated with 200 nm of evaporated niobium. Below 9 K, niobium helps shield the sample from stray magnetic fields; however, devices with higher $T_c$ are not shielded from magnetic fields while cooling through their superconducting transition. The inventors use indium (In) to mount a chip patterned with six resonators in the slot, as shown in FIGS. 8A and 8B. Devices are patterned on 100-μm-thick sapphire, which has low dielectric loss and minimizes spurious substrate resonances in the frequency band of interest. The planar resonator geometry shown in FIG. 8B includes a shorted quarter-wave (λ/4) section of a balanced-mode coplanar stripline waveguide (CPS), which couples directly to the $TE_{10}$ waveguide through dipole radiation (see electric field $\vec{E}$ in FIG. 8B), which the inventors enhance with dipole antennas. The inventors find that this design is well described by the analytic model presented in "Modeling of kinetic-inductance coplanar stripline with NbN thin films" by Keiji Yoshida et al. (Jpn. J. Appl. Phys. 31, 3844, 1992), which accounts for the thin-film linear KI. For very thin or narrow wire widths, the total inductance is dominantly kinetic, making the resonators extremely sensitive to superconducting-film properties. For clarity in FIG. 8B, a scale marker with a length of 3.3 mm is shown for reference. For clarity in FIG. 8C, a scale marker with a length of 50 µm is shown for reference.

Materials and Loss Mechanisms

Figure 9A:
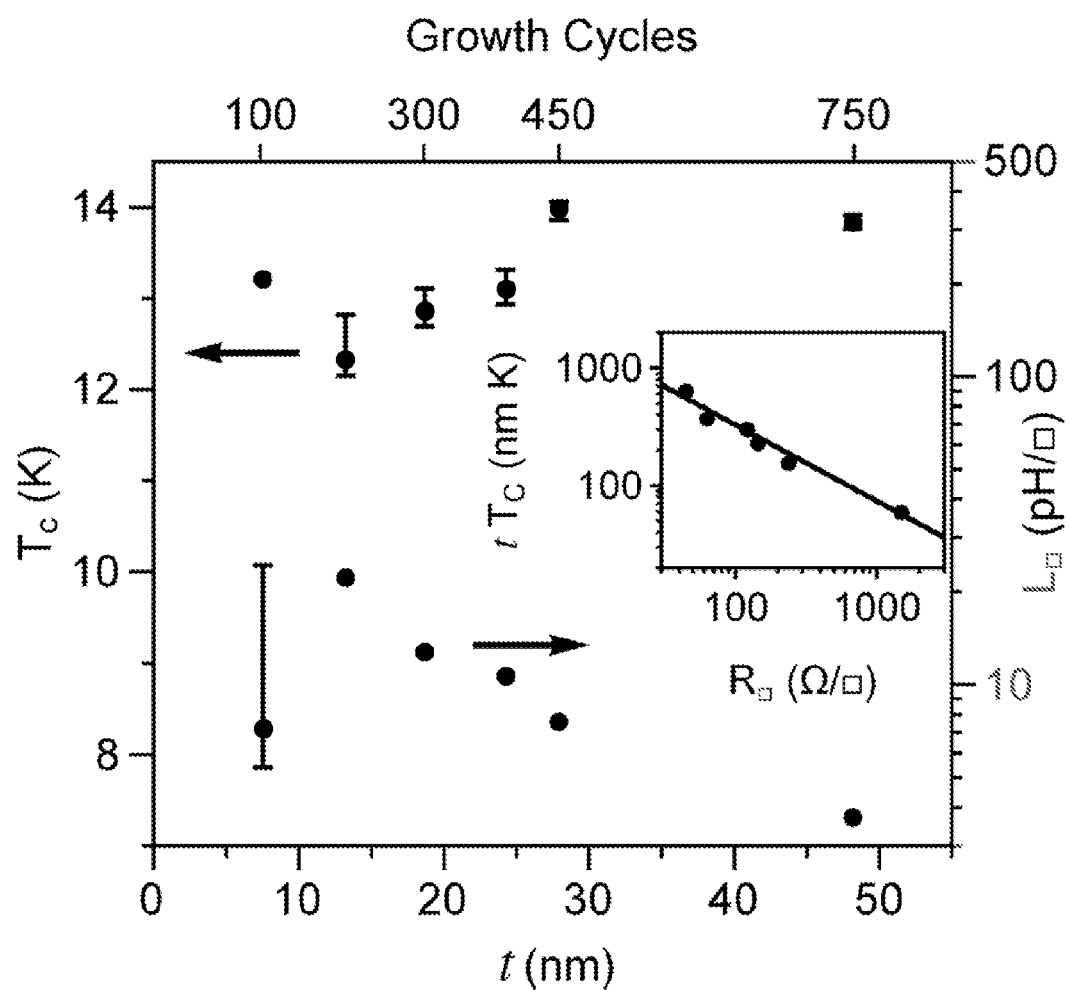
FIGS. 9A-9C illustrate material and loss characterization.
Figure 9B:
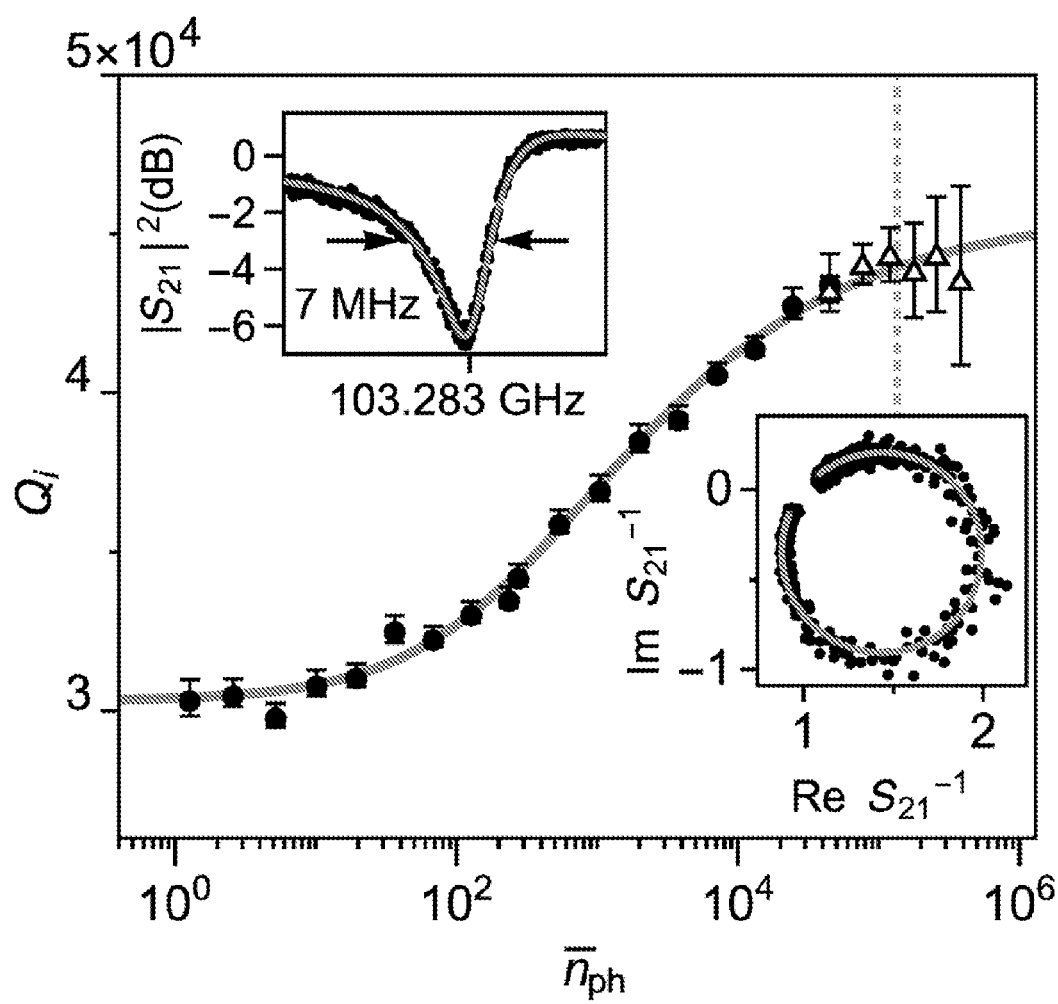
Figure 9C:
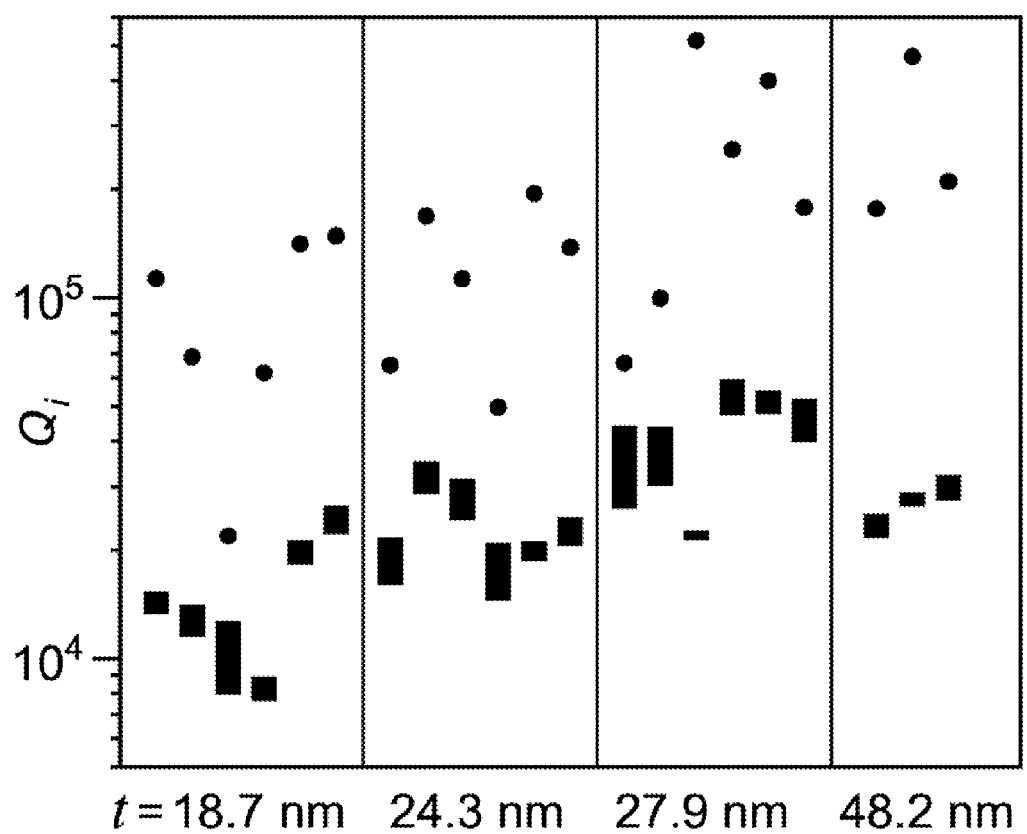

FIGS. 9A, 9B, and 9C illustrate material and loss characterization. Specifically, FIG. 9A is a plot of superconducting critical temperature $T_c$ (in K) and sheet inductance $L_\square$ (in pH/$\square$) of deposited NbN as a function of film thickness t (in nm). The corresponding number of growth cycles is indicated along the top of the plot. In FIG. 9A, bars denote temperatures corresponding to 90% and 10% reductions from the maximum resistivity. The inset of FIG. 9A shows the dependence of $tT_c$ (in mm K) on sheet resistance $R_\square$ (in $\Omega/\square$) with a fit to $tT_c = AR_\square^{-B}$, where A=6487±1607 and B=0.647±0.05 are the best-fit values of fit parameters A and B. FIG. 9B is a plot of the power dependence of the internal quality factor $Q_i$ for a resonator with $Q_e^* = 2.759 \times 10^4$ patterned on a 27.9-nm-thick NbN film measured at 1 K. The triangles in FIG. 9B are fits to a nonlinear-response model near and above the bifurcation power (see vertical dashed line). The solid line is a fit to a model including power-dependent loss from two-level systems and power-independent loss. The top inset in FIG. 9B is a plot of transmission $|S_{21}|^2$ (in dB) versus frequency that shows the lineshape centered at 103.283 GHZ and having a fitted linewidth of 7 MHz. The right inset in FIG. 9B is a plot of Im $S_{21}^{-1}$ versus Re $S_{21}^{-1}$, where $S_{21}$ is the forward transmission coefficient. For FIG. 9B, the fits correspond to an average photon occupation $\bar{n}_{ph} \approx 1.2$. FIG. 9C is a plot of internal quality factors $Q_i$ for resonators in this study, grouped by four values of the film thickness t (i.e., t=18.7 nm, 24.3 nm, 27.9 nm, and 48.2 nm). In FIG. 9C, the tops and bottoms of the bars correspond to fitted low-power and high-power saturation values, while points correspond to two-level-system-induced internal quality factor $Q_i$ with high-power loss subtracted.

To understand the quality of the NbN films grown by ALD and accurately predict resonant frequencies, the inventors characterize material properties with DC electrical measurements. All devices described herein are deposited on sapphire with a process based on that described in "Plasma-enhanced atomic layer deposition" by Mark J. Sowa et al. (J. Vac. Sci. Technol. A: Vacuum Surfaces Films 35, 01B14, 2017), and etched with a fluorine-based inductively coupled plasma (see "Device Fabrication" below). The inventors measure resistivity at ambient magnetic fields as a function of temperature (see "Film Characterization" below), which the inventors use to extract $T_c$ for a range of film thicknesses (see FIG. 9A). The inset in FIG. 9A shows that the films follow a universal relation observed for thin superconducting films linking $T_c$, film thickness t, and sheet resistance $R_\square$: the inventors find that the results are similar to those for NbN deposited with other methods. For thicker films, $T_c$ appears to saturate at 13.8-13.9 K, which is comparable to what was found in other studies, while decreasing to 8.7 K for the thinnest film (t=7 nm), which can be attributed to disorder-enhanced Coulomb repulsions. The inventors also find that the superconducting transition width increases greatly for the thinner films, which can in turn be attributed to a disorder-broadened density of states or reduced vortex-antivortex pairing energies at the transition.

From the resistivity and critical temperature, the inventors determine the sheet inductance $L_\square = \hbar R_\square / \pi \Delta_0$, where the normal sheet resistance $R_\square = \rho_n / t$ is taken as the maximum value of normal resistivity $\rho_n$, occurring just above $T_c$, and $\Delta_0 = 2.08 T_c$ is the superconducting energy gap predicted by Bardeen-Cooper-Schrieffer (BCS) theory for NbN. The inventors observe a monotonic increase in $L_\square$ for thinner films, achieving a maximum $L_\square = 212$ pH/$\square$, comparable to that for similar high-KI films.

By characterizing complex transmission spectra of resonators fabricated on a range of film thicknesses, the inventors explore loss mechanisms at millimeter-wave frequencies. The sheet inductance, thickness, and $T_c$ measured for a given film are used to adjust the resonator design length. This design spreads resonances out in frequency from 80 to 110 GHz, while varying antenna lengths allows us to adjust coupling strengths. A typical normalized transmission spectrum taken at single-photon-occupation powers ($\bar{n}_{ph} \approx 1.2$) is shown in the inset in FIG. 9B. On resonance, the inventors observe a dip in magnitude, which at low powers is described well by $$S_{21} = 1 - \frac{Q}{Q_e^*} \frac{e^{i\phi}}{1 + 2iQ\frac{(\omega - \omega_0)}{\omega_0}}, \quad (1)$$

where $Q^{-1} = Q_i^{-1} + \text{Re } Q_e^{-1}$ and the coupling quality factor $Q_e = Q_e^* e^{-i\phi}$ has undergone a complex rotation $\phi$ due to an impedance mismatch, likely induced by the sapphire chip and slot altering the waveguide geometry. The plot of fitted internal quality factors with respect to photon occupation in FIG. 9B shows that $Q_i$ increases with power. This can be described by a power-dependent saturation mechanism, likely originating from two-level systems (TLS) in the slow-growing amorphous surface oxide. At high powers, $Q_i$ approaches a limit, indicating that another power-independent loss mechanism, such as dielectric or radiative loss, is dominant in this regime. For some samples, this limit is obscured by the early onset of nonlinear effects (see "BCS-Conductivity Temperature Dependence" below for the discussion of temperature-dependent loss mechanisms).

To study effects of film thickness on $Q_i$, the inventors repeat the measurements summarized in FIG. 9B for devices ranging in thickness from 19.5 to 48.8 nm and show the results in FIG. 9C. The inventors plot the low-power and high-power limits of $Q_i$ as well as a lower bound for the TLS-induced $Q_i$ for devices from six separate chips grouped by film thickness. For films thicker than 20 nm, the inventors consistently find $Q_i > 10^4$, with the TLS limiting $Q_i$ around $10^5$. The inventors find a weak correlation of $Q_i$ with film thickness, which could be explained by several additional potential sources of loss. Thinner films exhibiting higher disorder have also been connected with a nonlinear resistance, resulting in loss mechanisms proportional to kinetic inductance (see "Controlling Nonlinearity in the Presence of Additional Losses" below). Additionally, since the devices are unshielded from ambient magnetic fields at the superconducting transition, vortices trapped in the thin films may cause additional dissipation dependence on film thickness. Resonances patterned from thinner films proved experimentally difficult to distinguish from background fluctuations, possibly indicating low values of $Q_i$ or frequencies outside the measurement bandwidth.

Kerr Nonlinear Dynamics

Figure 10A:
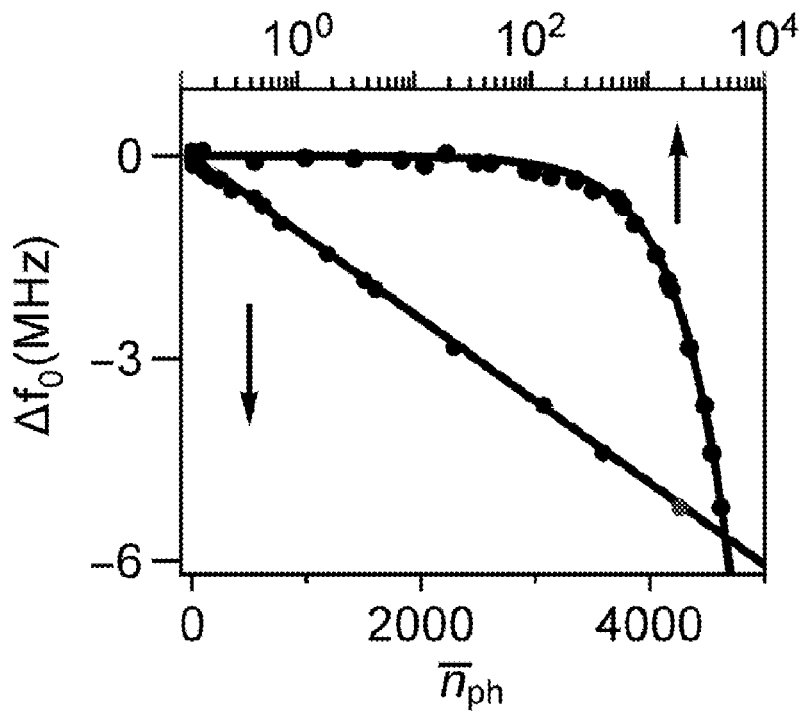
FIGS. 10A and 10B illustrate measurements of Kerr nonlinearity.
Figure 10B:
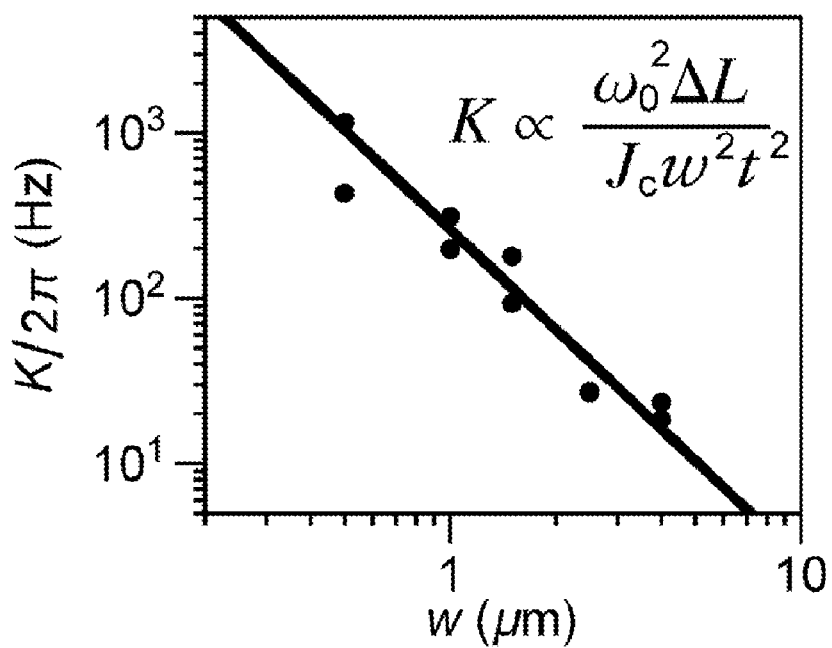

FIGS. 10A and 10B illustrate measurements of Kerr nonlinearity. Specifically, FIG. 10A is a plot of frequency shift $\Delta f_0$ (in MHz) versus average resonator photon number $\bar{n}_{ph}$ on a linear scale (bottom x-axis downward arrow) and a log scale (top x-axis upward arrow), where $\bar{n}_{ph}$ is accurate to within a factor of approximately 10. FIG. 10B is a plot of extracted self-Kerr coefficients K (in Hz) versus wire width w (in μm) for resonators fabricated from a 29-nm-thick film. The predicted $w^{-2}$ dependence Im($S_{21}$) versus Re($S_{21}$) is shown in FIG. 10B as a solid line. The inventors find no significant impact of w on $Q_i$.

Figure 11A:
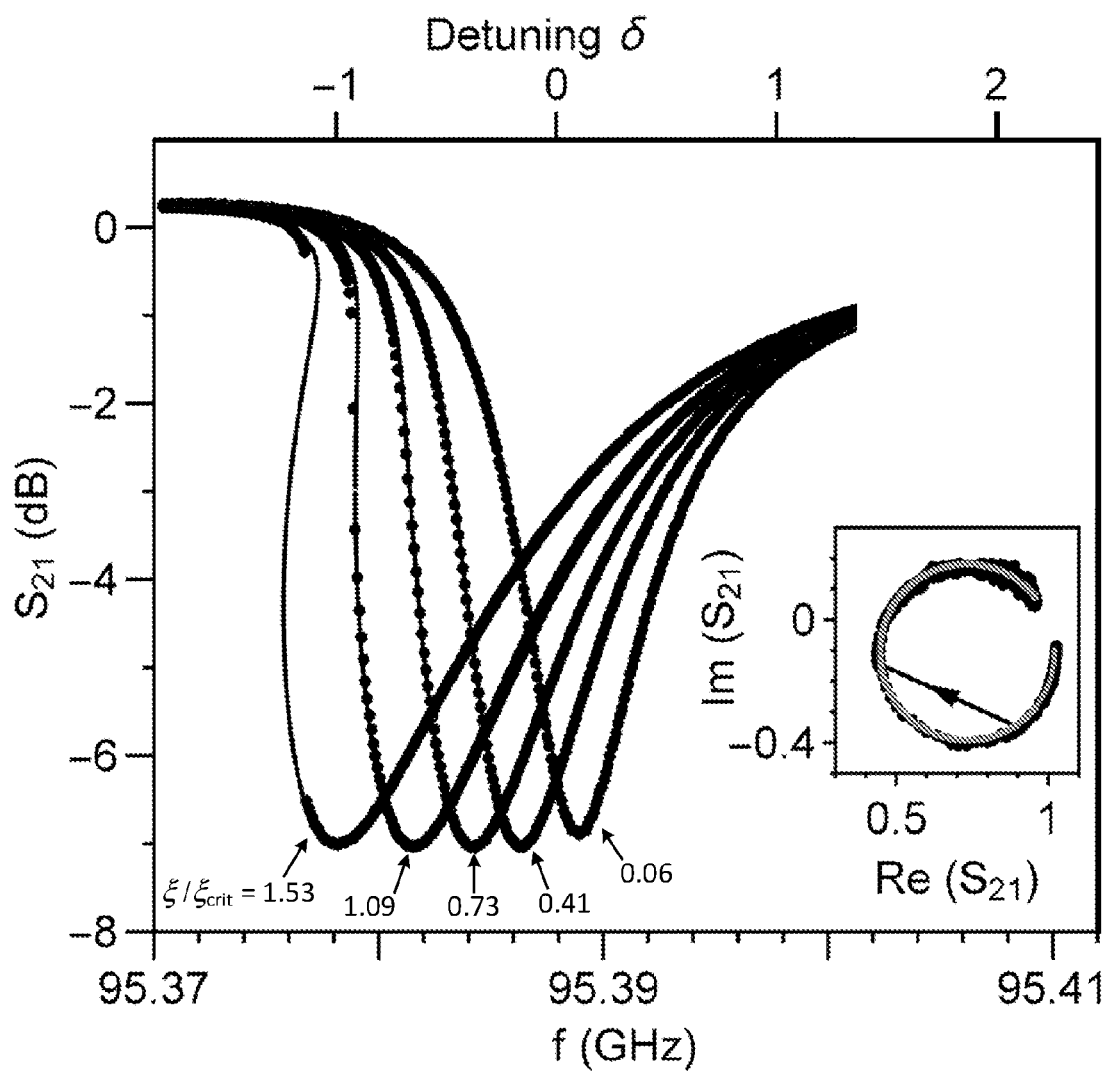
FIGS. 11A-11C illustrate nonlinear response and four-wave mixing.
Figures 11B, 11C:
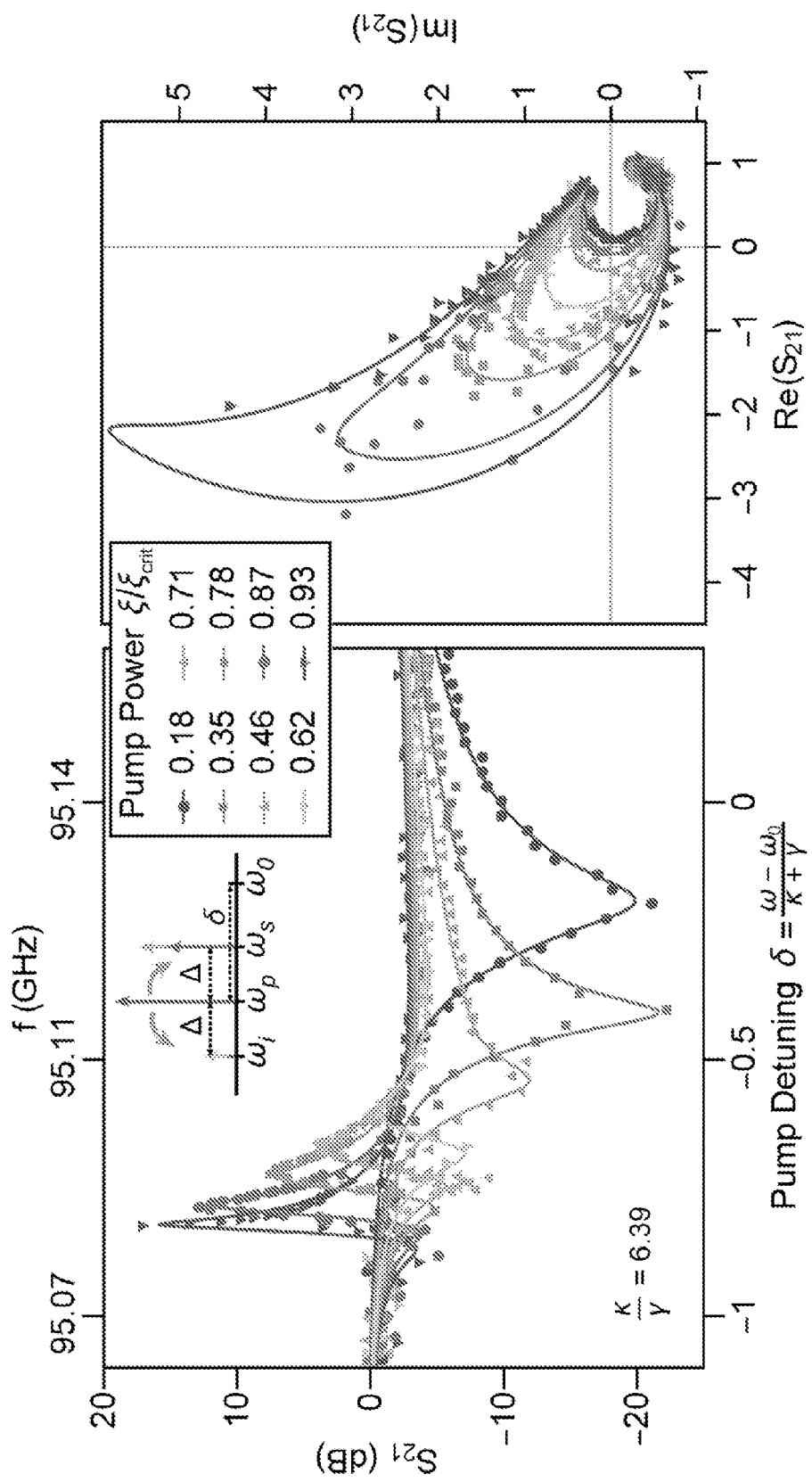

FIGS. 11A, 11B, and 11C illustrate nonlinear response and four-wave mixing. Specifically, FIG. 11A is a plot showing transmission $S_{21}$ (in dB) versus frequency (in GHz) of a typical resonance at a range of powers near and above the bifurcation (i.e., $\xi/\xi_{crit}$=0.06, 0.41, 0.73, 1.09, and 1.53, where $\xi$ is the reduced circulating power and $\xi_{crit}$ is the value of the reduced circulating power at which bifurcation starts). The transmission $S_{21}$ shows good agreement with a Kerr nonlinear response. The inset of FIG. 11A shows overlaid data and fits in the complex plane just below and above the bifurcation point. FIGS. 11B and 11C show parametric conversion gain with a 95.1-GHz device with the same film thickness as for FIG. 11A, as a function of reduced detuning δ for a fixed signal detuning Δ of +450 kHz, taken at increasing pump powers (i.e., $\xi/\xi_{crit}$=0.18, 0.35, 0.46, 0.62, 0.71, 0.78, 0.87, and 0.93 as shown in FIGS. 11B and 11C). Solid lines correspond to the theoretical response. The initial forward deamplification is better understood when the response is viewed in the complex plane (i.e. Im($S_{21}$) versus Re($S_{21}$)) of FIG. 11C, where the inventors observe smooth parametric deformation from the single-tone response.

A key aspect of high-KI resonators is their fourth-order nonlinearity, an important component for realizing quantum devices, and similar to the nonlinearity term found in Josephson junctions for low powers. Nonlinear kinetic inductance takes the general form $L=L_k+\Delta L_k I^2/I_c^2$, where $L_k$ is the linear kinetic inductance, $\Delta L_k$ is the nonlinear kinetic inductance, and $I_c$ is the critical current, which sets the nonlinearity scale. This adds nonlinear terms of the form $(\hbar/2)K(\alpha^\dagger\alpha)^2$ to the Hamiltonian, with $K \propto \omega_0^2 \Delta L_k/I_c^2$, as shown in FIG. 10B shifting the fundamental frequency wo by the self-Kerr constant K for each photon added. To characterize the strength of the resonator nonlinearity, the inventors measure the resonance-frequency shift as a function of photon number. A linear fit for a resonator (t=29 nm, w=0.5 μm) yielding K/2π=1.21 kHz is shown in FIG. 10A. Although the statistical errors of the fits are small, the inventors note this value has a multiplicative uncertainty of $10^{\pm 0.4}$. Despite careful calibration, systematic variations in received power across the chip and between separate experiments limit the best estimates of photon number to within a factor of approximately 10. By writing the self-Kerr coefficient in terms of a current density $I_c=J_c wt$, the inventors expect K to scale as $w^{-2}$, so in FIG. 10B the inventors plot the self-Kerr coefficients of the devices (and error relative to each other) with respect to their wire width. These results are comparable to self-Kerr-strengths of granular aluminum nanowires or weakly nonlinear Josephson junctions.

A hallmark of Kerr nonlinearity is the distortion of the transmission lineshape in frequency space at high powers, ultimately leading to a multivalued response above the bifurcation power. If the inventors rewrite $\gamma=\omega_0/Q_i$ and $K=\omega_0/\text{Re}Q_e$, the steady-state nonlinear response takes the form (see "Kerr Nonlinear Dynamics for a Side-Coupled Resonator" below):

$$S_{21} = 1 - \frac{\kappa}{\kappa+\gamma} \frac{1+\tan\phi}{1+2i(\delta-\xi n)}, \quad (2)$$

where the frequency detuning is written in reduced form $\delta=\omega-\omega_0/\kappa+\gamma$, and $n=n_{ph}/\tilde{n}_{in}$ is a function of frequency and reduced circulating power $\xi=K[\kappa/hf(\kappa+\gamma)^3]P_{in}$. The inventors plot steady-state transmission data taken near the bifurcation power in FIG. 11A along with fits to Eqn. 2, with system parameters κ, ϕ, and $\omega_0$ constrained to low-power values and find the model to be in good agreement with measurements.

Figure 12:
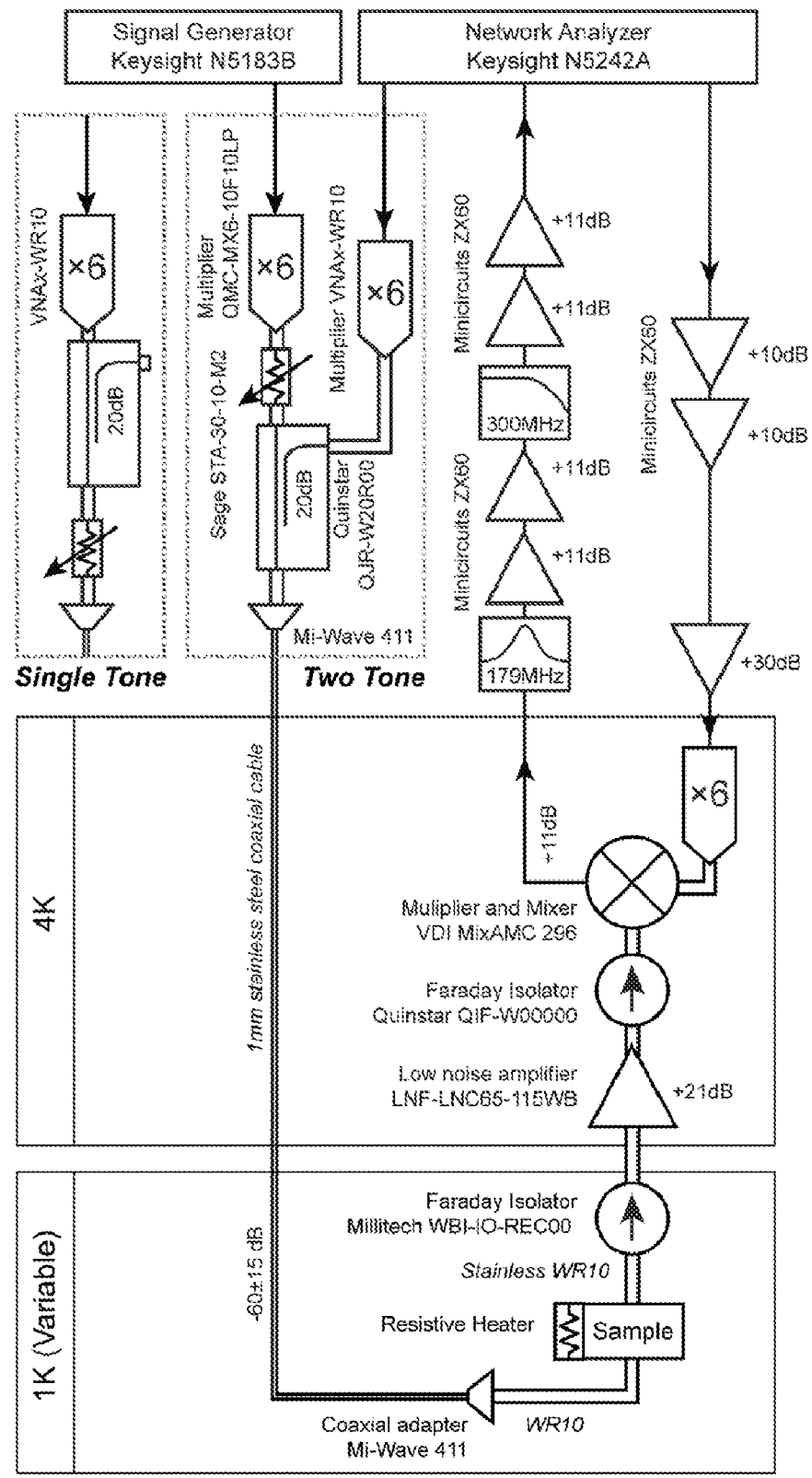
FIG. 12 is a diagram of a millimeter-wave measurement setup for single-tone and two-tone configuration.

FIG. 12 is a diagram of a millimeter-wave measurement setup for single-tone and two-tone configuration. With the measurement setup of FIG. 12, the inventors further explored nonlinear dynamics by stimulating degenerate four-wave mixing with the addition of a continuous-wave classical pump. When a high-power pump tone at frequency $\omega_p$ is on resonance with the down-shifted resonance frequency, and a low-power signal at frequency $\omega_s$ is at a frequency detuning Δ from the pump, the inventors expect to observe the net conversion of two pump photons into a signal photon (with frequency $\omega_s$) and an idler photon (with frequency $\omega_i$) at their sum-average frequency (see FIG. 11B, inset). This effect is most pronounced when all frequencies are within the resonant bandwidth, and the pump power $\xi$ approaches the bifurcation point $\xi_{crit}$, but is limited by the loss fraction γ/κ. The inventors measure the pump-signal conversion efficiency of a high-bandwidth, high-K device in the propagation direction as a function of reduced detuning δ for increasing pump powers $\xi$ (see FIGS. 11B and 11C). The data in FIGS. 11B and 11C were obtained for a fixed signal power corresponding to an average photon occupation of $\bar{n}_{ph} \approx 9$. The inventors find that the observed behavior is accurately captured with an analytical model (see "Kerr Nonlinear Dynamics for a Side-Coupled Resonator" below) based on a theoretical analysis and overlay the results. For increasing pump powers, the inventors observe smooth parametric deformation from the single-tone response in the complex plane. For higher powers, the inventors observe increasing gain with decreasing linewidth, up to a maximum measured forward efficiency of +16 dB. The slight curvature in the complex plane is a result of the finite pump-signal detuning Δ.

Kerr Nonlinear Dynamics for a Side-Coupled Resonator

This section describes a procedure to decompose a side-coupled resonator into a linear network containing a one-sided cavity, which is well understood in the language of input-output theory used in quantum optics. With this procedure, well-modelled dynamics of a Kerr nonlinear cavity driven in reflection can be mapped to a side-coupled resonator measured in transmission.

Figure 13A:
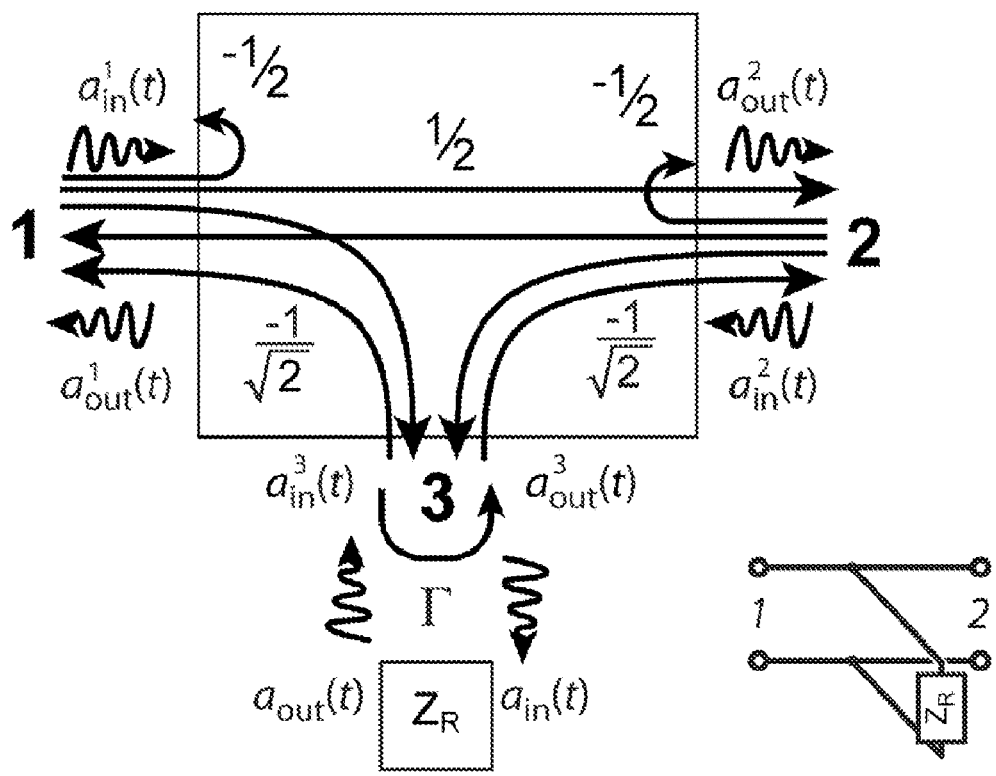
FIGS. 13A-13C illustrate a side-coupled resonator model.
Figure 13C:
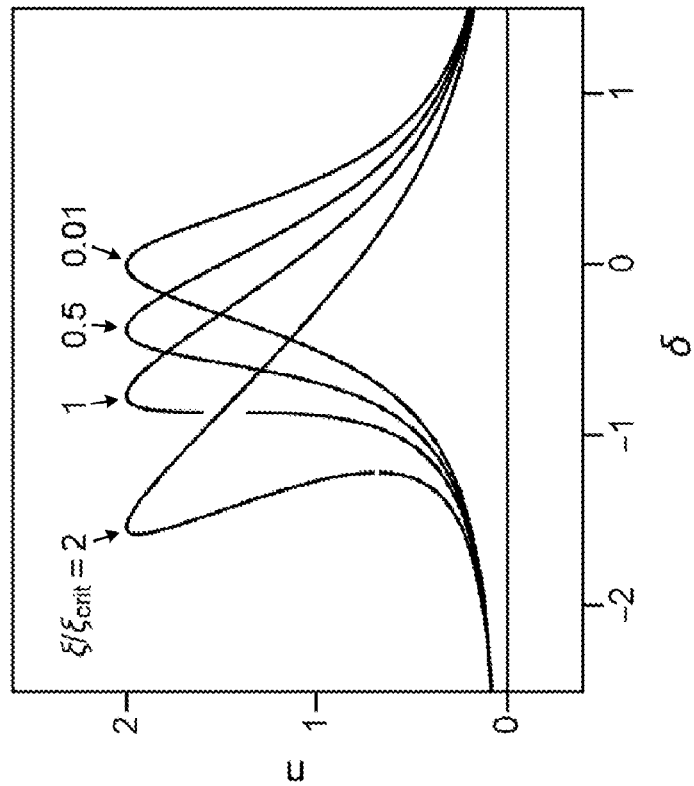
Figure 13B:
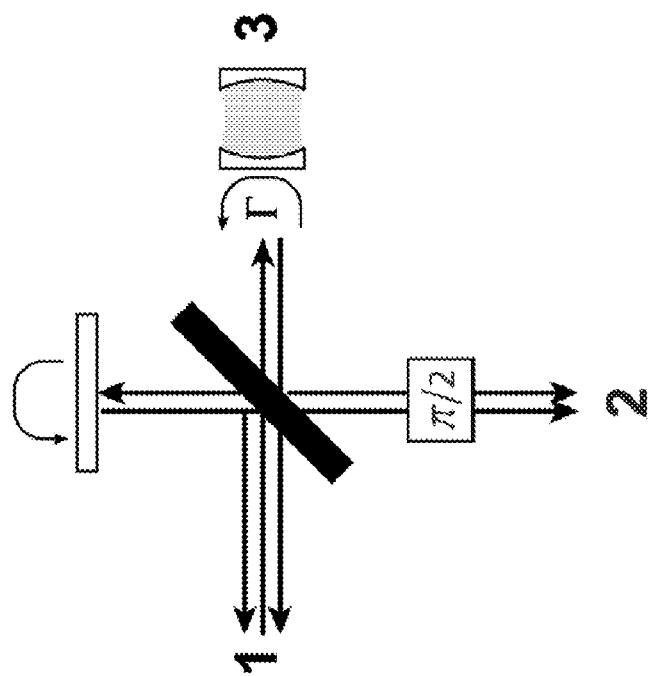

FIGS. 13A, 13B, and 13C illustrate a side-coupled resonator model. Specifically, FIG. 13A shows a three-port network of an H-plane splitter coupled to a black-box resonator. FIG. 13A shows corresponding transmission coefficients (e.g., ½, −½, and −1/√2) with input and output fields labeled by port (i.e., $a_{in}^1(t)$ is the input field for the port labeled 1, $a_{out}^1(t)$ is the output field for the port labeled 1, $a_{in}^1(t)$ is the input field for the port labeled 2, $a_{out}^2(t)$ is the output field for the for the port labeled 2, $a_{in}^3(t)$ is the input field for the port labeled 3, and $a_{out}^3(t)$ is the output field for the port labeled 3). The inset of FIG. 13A shows the equivalent circuit network. FIG. 13B shows an analogous configuration to the three-port network of FIG. 13A for an optical cavity, adjusted for boundary conditions. FIG. 13C is a plot of normalized photon number n as a function of reduced pump frequency δ for reduced drive strengths $\xi$, where $\xi_{crit}=-2/\sqrt{27}$ (i.e., $\xi/\xi_{crit}$=0.01, 0.5, 1, and 2).

Based on the circuit model in FIG. 8D, and the argument that a symmetrically coupled resonator will radiate equally in both directions, the inventors consider the three-port H-plane splitter. As shown in FIG. 13A, this lossless but unmatched network has symmetric ports 1 and 2 corresponding to the transmission line, and matched port 3 leading to the single-port coupled resonator $Z_R$. [This system can also be described by a network consisting of a 50:50 beam splitter, a perfect mirror, and a $\pi/2$ phase shifter as shown in FIG. 13B, which yields the same key results if correct boundary conditions are carefully used]. If a black-box element is placed on port 3, the input and output fields may be described in terms of the waveguide input and output fields:

$$\begin{pmatrix} a_{in}(t) \\ a_{out}(t) \end{pmatrix} = \frac{1}{\sqrt{2}} \begin{pmatrix} a_1^{in}(t) + a_2^{in}(t) \\ a_1^{out}(t) + a_2^{out}(t) \end{pmatrix} \quad (A1)$$

If the black box is described with an arbitrary reflection term $\delta = a_{out}(t)/a_{in}(t)$, the scattering matrix of the system reduces to:

$$S = \frac{1}{2}\begin{pmatrix} \Gamma - 1 & \Gamma + 1 \\ \Gamma + 1 & \Gamma - 1 \end{pmatrix} \quad (A2)$$

The inventors now verify that far off-resonance, for an open-circuit perfect reflection $\Gamma \to 1$, perfect transmission is recovered. With a map of waveguide inputs and outputs, the black box is replaced with a Kerr nonlinear one-port coupled resonator, which has the steady state condition $$i(\omega - \omega_0)a + \frac{\kappa + \gamma}{2}a - iK|a|^2 a^* = \sqrt{\kappa}\, a_{in} = -\sqrt{\frac{\kappa}{2}}\, a_1^{in}. \quad (A3)$$

The inventors have been careful to use the microwave convention for Fourier transforms, and $n_{ph} = |a|^2$ corresponds to the average number of photons in the resonator. Multiplying Eqn. A3 by its complex conjugate yields an equation governing the normalized number n of photons in the resonator:

$$\left(\frac{1}{4} + \delta^2\right) - 2\delta\xi n^2 + \xi^2 n^3 = \frac{1}{2}, \quad (A4)$$

where $$n = \frac{|a|^2}{|a_{in}|^2} \frac{(\kappa + \gamma)^2}{\kappa} \quad (A5)$$

$$\xi = \frac{|a_{in}|^2 \kappa K}{(\kappa + \gamma)^3}, \text{ and} \quad (A6)$$

$$\delta = \frac{\omega - \omega_0}{\kappa + \gamma}. \quad (A7)$$

FIG. 13C is a plot of n as a function of $\delta$ for varying drive strengths $\xi$. In FIG. 13C, n reaches a maximum value of 2. At the critical value $\xi_{crit} = -2/\sqrt{27}$, Eqn. A4 has three real solutions, leading to the onset of bifurcation. Based on the resonator boundary conditions $a_{out} = a_{in} + a\sqrt{\kappa}$ and Eqn. A3, the reflection coefficient $\Gamma$ will be given by $$\Gamma = 1 - \frac{\kappa}{\kappa + \gamma} \frac{1}{\frac{1}{2} + i(\delta - \xi n)}. \quad (A8)$$

Far off resonance, an impedance mismatch on output port 2 results in nonzero reflection $|r| = \sin\phi$ and transmission $|t| = \cos\phi$ less than unity. To account for this nonzero reflection while preserving the unitarity of the S matrix, transformations of the form $e^{i\phi}$ were applied to each path of the three-port network, yielding $S_{21} = (Te^{i\phi} + e^{-i\phi})/2$. Mapping Eqn. A8 to the modified three-port network yields the result obtained above:

$$S_{21} = 1 - \frac{\kappa}{\kappa + \gamma} \frac{e^{i\phi}}{\cos\phi} \frac{1}{1 + 2i(\delta - \xi n)}. \quad (A9)$$

At low powers ($\xi n \to 0$), Eqn. A9 reduces to Eqn. 1.

A similar approach is followed to obtain expressions for parametric conversion gain. With use of microwave conventions for Fourier transforms, the one-port gain of a signal detuned from the pump by $+\Delta = \omega_s - \omega_p/\kappa + \gamma$ is given by $$g_s = \frac{a_\Delta^{out}}{a_\Delta^{in}} 1 - \frac{\kappa}{\kappa + \gamma} \frac{\frac{1}{2} - i(\delta - 2\xi n - \Delta)}{(i\Delta + \lambda_+)(i\Delta + \lambda_-)}, \quad (A10)$$

with $\lambda_\pm = \frac{1}{2} \pm \sqrt{(\xi n)^2 - (\delta - 2\xi n)^2}$. Use of the three-port-network transformations above yields the normalized forward (in the direction of propagation) signal gain:

$$g_s^+ = \frac{a_{2,\Delta}^{out}}{a_{1,\Delta}^{in}} 1 - \frac{\kappa}{\kappa + \gamma} \frac{e^{i\phi}}{\cos\phi} \frac{\frac{1}{2} - i(\delta - 2\xi n - \Delta)}{(i\Delta + \lambda_+)(i\Delta + \lambda_-)}. \quad (A11)$$

Device Fabrication

All devices were fabricated on 100±25 μm thick C-plane (0001) sapphire wafers with a diameter of 50.8 mm. Wafers were cleaned with organic solvents (toluene, acetone, methanol, isopropanol, and deionized (DI) water) in an ultrasonic bath to remove contamination. The wafers were then annealed at 1200° C. for 1.5 hours. Before film deposition, the wafers underwent a second cleaning with organic solvents (toluene, acetone, methanol, isopropanol, and DI water) in an ultrasonic bath, followed by 2 minutes of cleaning at 50° C. in a Nano-Strip™ etch, and a rinse with high-purity DI water. The wafers then underwent a dehydration bake at 180° C. in air for 3 minutes.

Immediately afterwards, the wafers were loaded into an Ultratech Fiji G2 plasma-enhanced-atomic-layer-deposition tool for metallization, where the wafers underwent a one-hour bake at 300° C. under a vacuum continuously purged with 5 sccm of argon gas. Chamber walls matched the substrate temperature. (t-Butylimido)tris(diethylamido)niobium(V) (TBTDEN) was used as the niobium precursor, which was kept at 100° C. and delivered by a precursor Boost™ system, which introduced argon gas into the precursor cylinder to promote material transfer of the low vapor pressure precursor to the wafer. The deposition cycle consisted of three 0.5-s pulses of boosted TBTDEN followed by 40 s of 300-W plasma consisting of 80 sccm of hydrogen and 5 sccm of nitrogen. A flow of 5 sccm of nitrogen and 10 sccm of argon was maintained throughout the deposition process. After deposition, the wafer was passively cooled to 250° C. under vacuum.

Following deposition, the wafers were cleaned with DI water in an ultrasonic bath to remove particulates, then underwent a dehydration bake at 180° C. in atmosphere for 3 minutes before being coated with resist. For optical lithography, to avoid defocusing from wafer deformation, the wafers were mounted to a silicon handle wafer with AZ MIR 703 photoresist cured at 115° C. The wafers were then coated with approximately 1 µm of AZ MiR 703 positive I-line photoresist, and exposed with a Heidelberg MLA150 direct writer. For electron-beam lithography, the wafers were first coated with approximately 200 nm of ARN 7520 negative resist, followed by 40 nm of Elektra AR PC 5090 conductive resist, and then exposed with a Raith EBPG5000 Plus electron-beam writer. The conductive coating was removed by a 60-s DI water quench. Both optical and electron-beam resists were baked at 110° C. for further hardening, and then developed for 60 s in AZ MIF 300, followed by a 60-s quench in DI water. Rounded corners of the devices are by design to diffuse electric fields and reduce coupling to two-level systems.

The NbN films were etched in a Plasma-Therm® inductively coupled plasma etcher. Etch chemistry, substrate etch depth and etch time are known to affect planar resonator quality factors, in particular due to the formation of cross-linked polymers at the metal-resist interface after the bulk metal is etched away. For this reason, sample etch times were scaled to metal thickness, with a fixed overetch time of 30 s to ensure complete metal removal. A fluorine-based ICP etch chemistry was used with a plasma consisting of 15 sccm of $SF_6$, 40 sccm of $CHF_3$, and 10 sccm of Ar. ICP and bias powers were kept at 100 W, and the substrate was cooled to 10° C. Following etching, the resist was stripped in a combination of acetone and 80° C. Remover PG (N-methyl-2-pyrrolidone) which also serves to release the wafer from the silicon carrier wafer. The wafers were then cleaned with organic solvents (acetone, 2-propanol) and DI water, coated with an approximately 2 µm protective layer of photoresist, and diced into 3.3 mm×2.3 mm chips. These chips were stripped of protective resist with 80° C. Remover PG, cleaned with organic solvents (acetone, 2-propanol), and DI water, dried on an unpolished sapphire carrier wafer in air at 80° C., then mounted with indium wire in the copper box described previously.

Film Characterization

DC film-characterization measurements were performed with a Quantum Design physical property measurement system (PPMS) with a base temperature of 1.8 K. Test structures consisting of a 1.5 mm×40 µm wire were patterned on 7 mm×7 mm chips undergoing the process described above (see Device Fabrication) along with device wafers, and were then wire-bonded for four-wire measurements. Finished structures were kept in a low vacuum (approximately 500 mTorr) to minimize oxide growth before measurement, as it was observed that $T_c$ decreases by up to 1 K for samples aged for several days in air, likely a result of oxide growth reducing the superconducting-film thickness.

After the sampled were cooled to 10 K (3 K in the case of the 8-nm film) in ambient magnetic fields, it was verified that the residual resistance of the film dropped below the instrument noise floor of around $5 \times 10^{-3} \Omega$. After thermalization for 1 hour, the samples were warmed up to 20 K at a rate of 0.1 K/min, and were then warmed to 300 K at a rate of 1 K/min.

Figure 14:
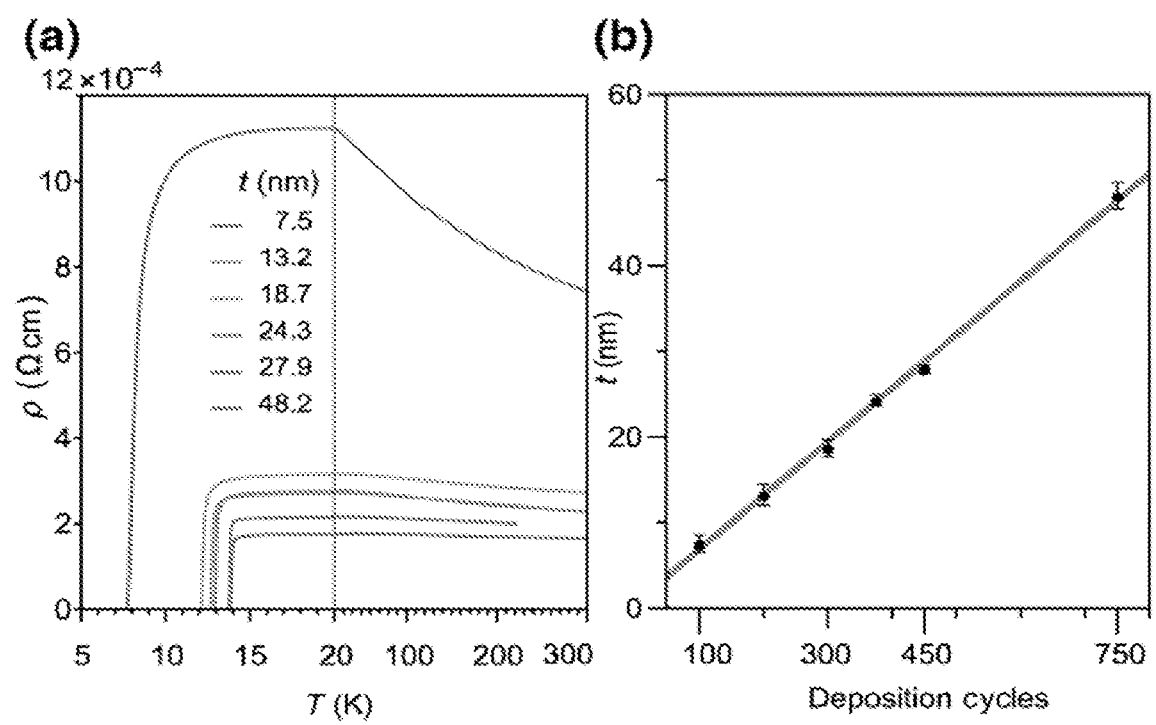
FIGS. 14A and 14B show plots of film measurements.

FIGS. 14A and 14B show plots of film measurements. Specifically, FIG. 14A is a plot of measured resistivity ρ (in Ω cm) as a function of temperature T (in K) for several films with thicknesses between 7.5 nm and 48.2 nm (specifically, thicknesses of 7.5 nm, 13.2 nm, 18.7 nm, 24.3 nm, 27.9 nm, and 48.2 nm). The data in FIG. 14A was used to extract $T_c$ and $ρ_n$ and calculate R and L for the films. Resistivity decreases with temperature above the superconducting transition, which is typical for strongly disordered materials. FIG. 14B is a plot of thickness t (in nm) as a function of deposition cycles, as measured by profilometry. A best-fit line 720 has a slope of 0.63 Å per cycle.

Millimeter-Wave Measurement Setup and Calibration

All millimeter-wave characterizations were performed in a custom-built $^4$He adsorption refrigerator with a base temperature of 0.9 K and a cycle duration of 3 hours (see FIG. 8A). Millimeter-wave signals between 75 and 115 GHz were generated at room temperature by sending microwave signals between 12 and 19 GHz into a frequency multiplier. The generated $TE_{10}$ waveguide mode was converted to a coaxial mode in a 1-mm-diameter stainless steel and beryllium copper coaxial cable, which carries the signal to the 1-K stage of the refrigerator, with mechanical thermalization at each intermediate stage, and then converts the coaxial signal back to a WR10 waveguide, which leads to the device under test. The cables and waveguide-cable converters have a combined frequency-dependent loss ranging from 55.6 to 75.8 dB in the W band, which is dominated by the cable loss. The inventors confirmed the attenuation and incident device power at room temperature with a calibrated power meter (Agilent W8486A) and a referenced measurement with a VNAx805 receiver. However, cryogenic shifts in cable transmission and minute shifts in waveguide alignment likely result in small variations in transmitted power. The inventors further confirmed the applied power by measuring the lowest observed bifurcation point, and finding that most bifurcation powers agree with predictions, yielding a maximum combined power uncertainty of approximately ±5 dBm, which sets the uncertainty in our photon-number measurements.

The sample is isolated from both millimeter-wave and thermal radiation from the 4-K plate with two stainless steel waveguides two inches long and a Faraday isolator. Using a resistive heater and a standard-curve ruthenium oxide thermometer, temperature sweeps were performed on the sample without significantly affecting the refrigerator-stage temperatures. A low-noise amplifier ($T_N \sim 28$ K) amplifies the signal before it passes through another Faraday isolator, which further blocks any leaking signals. The signal then passes to a cryogenic mixer, which converts the signal to radio waves (e.g., 100 to 300 MHz), which is filtered, amplified, and measured at room temperature with a network analyzer. The signal power was controlled by varying the input attenuation and multiplier input power, confirming the incident power at the sample with room-temperature calibrations as described above. For two-tone measurements, the signal path was moved to the 20-dB port of the input directional coupler, and an additional frequency multiplier fed by a reference-locked microwave signal generator was added. For single-tone measurements, the 20-dB port is capped with a short to minimize incident stray radiation.

BCS-Conductivity Temperature Dependence

Figure 15A:
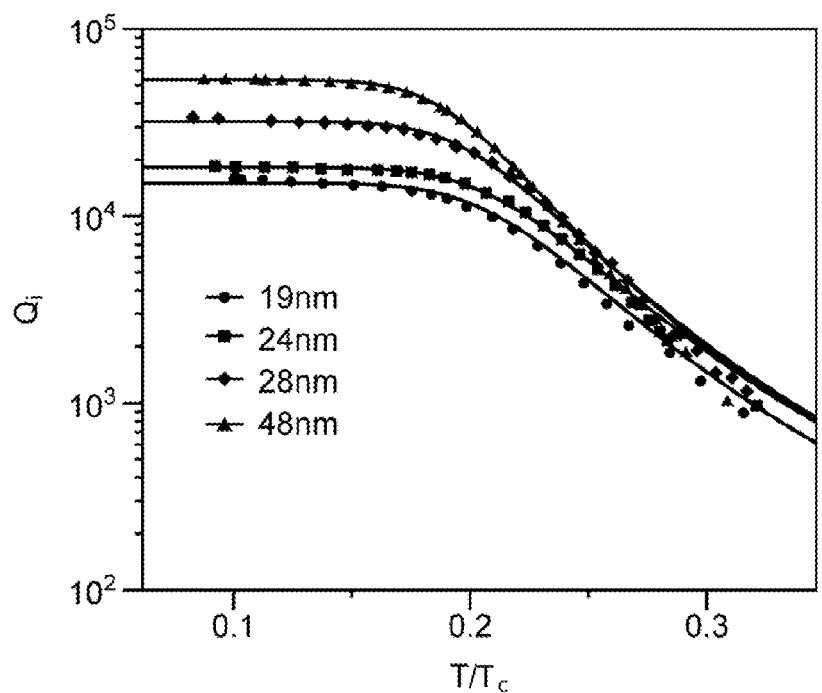
FIGS. 15A-15C illustrate the temperature-dependence of BCS superconductivity.
Figure 15B:
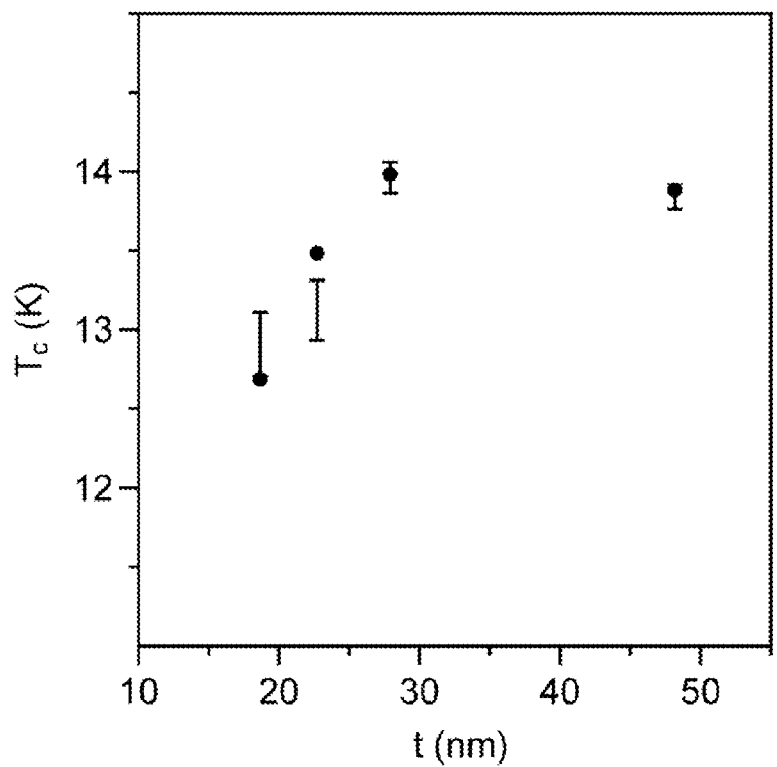
Figure 15C:
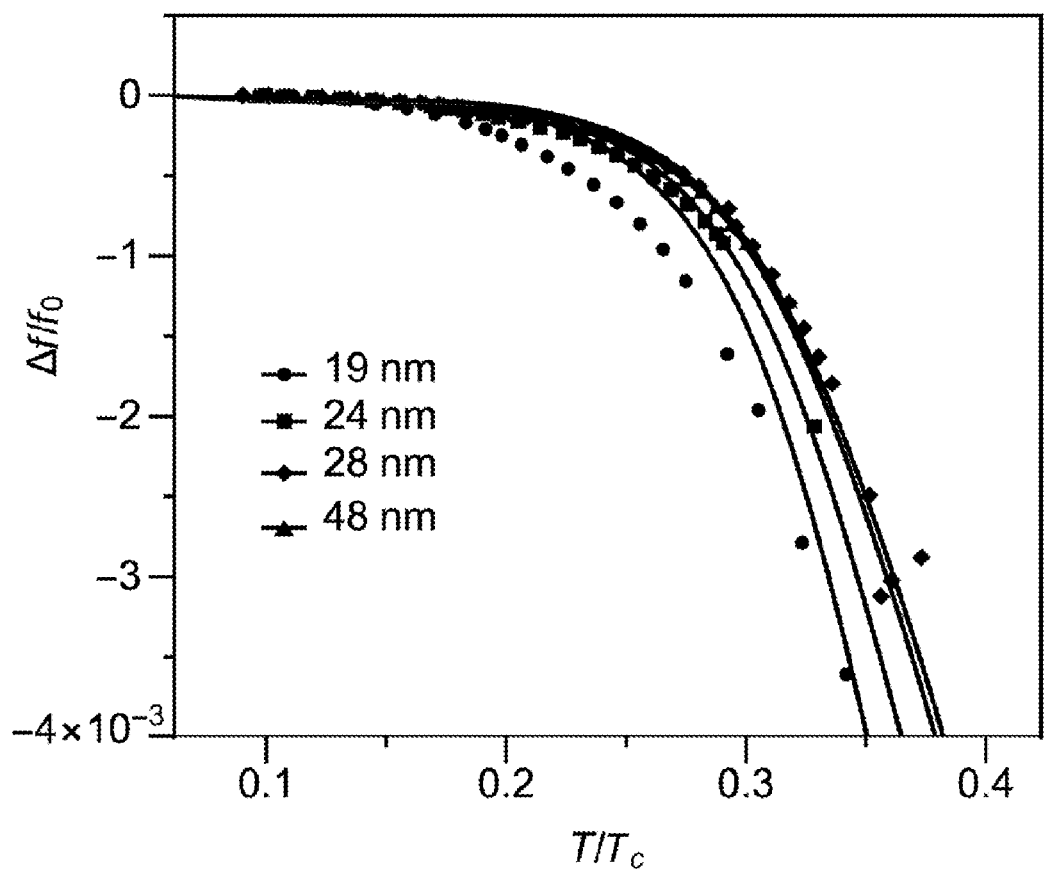

FIGS. 15A, 15B, and 15C illustrate the temperature-dependence of BCS superconductivity. Specifically, FIG.

15A is a plot of high-power quality factor $Q_i$ as a function of normalized temperature $T/T_c$ for four resonators of different film thickness (i.e., 19 nm, 24 nm, 28 nm, and 48 nm). In FIG. 15A, solid lines correspond to a BCS model with $T_c$ and kinetic inductance fraction α as fit parameters. FIG. 15B is a plot of critical temperature $T_c$ (in K) versus thickness t (in nm), where the plotted data points are extracted from fits to the BCS model and obtained from DC resistivity measurements. FIG. 15C is a plot of normalized frequency shift $\Delta f/f_0$ of the four resonators (i.e., having film thicknesses of 19 nm, 24 nm, 28 nm, and 48 nm) as a function of normalized temperature $T/T_c$ with overlaid predictions from the Mattis-Bardeen equations for $\sigma_2/\sigma_n$ with parameters taken from the fits in FIG. 15A.

Because of the large kinetic inductance fraction α, or magnetic field participation ratio of the thin-film resonators, higher sensitivity to loss from complex conductivity is expected, which in turn is sensitive to temperature. FIG. 15A shows the quality factor decrease as a function of temperature for four resonators with different thicknesses. In FIG. 15A, solid lines correspond to a model of the form $$Q_i(T)^{-1} = Q_{i,max}^{-1} + Q_\sigma(T)^{-1}, \tag{E1}$$

where $Q_{i,max}^{-1}$ is a temperature-independent upper bound arising from other sources of loss, and the conduction loss $Q_\sigma(T)$ is given by $$Q_\sigma(T) = \frac{1}{\alpha} \frac{\sigma_2(T, T_c)}{\sigma_1(T, T_c)}, \tag{E2}$$

where $\sigma_1$ and $\sigma_2$ are the real and imaginary parts, respectively, of the complex surface impedance. Values for $\sigma_1$ and $\sigma_2$ are calculated by numerically integrating the Mattis-Bardeen equations for $\sigma_1/\sigma_n$ and $\sigma_2/\sigma_n$. The parameters α and $T_c$ were used as fit parameters in the model. Below 2 K ($T/T_c \sim 0.15$), $Q_i$ saturates, which indicates that conduction loss does not limit $Q_i$ for these devices. The inventors note minor deviations from theory at higher temperatures, which may be a result of physical deviations from the standard-curve calibrations used for the ruthenium oxide thermometer. Since these resonators are fabricated with $Q_e > 10^4$, measuring resonators at higher temperatures where $Q_i$ is below $10^3$ proves experimentally challenging. FIG. 15B is a plot of the fitted $T_c$ values versus those obtained with DC measurements; this plot shows reasonable agreement for greater-thickness films. However, the uncertainty in temperature calibration combined with the relatively low saturation values result in fitted $T_c$ uncertainties of around 0.4 K.

BCS theory also predicts a shift in London length as a function of temperature, which in the dirty (high-disorder) limit is given by $$\frac{\lambda(T)}{\lambda(0)} = \frac{1}{\sqrt{\frac{\Delta(T)}{\Delta_0}\tanh\left(\frac{\Delta_0}{2k_b T}\right)}} \tag{E3}$$

This shift can be measured by tracking the resonance-frequency shift. For sufficiently large kinetic inductance fractions, or $L_k \gg L_g$, the kinetic inductance will dominate the total inductance, so the normalized frequency shift will be given by $$\frac{f_0(T)}{f_0(0)} = \sqrt{\frac{\Delta(T)}{\Delta_0}\tanh\left(\frac{\Delta_0}{2k_b T}\right)}. \tag{E4}$$

FIG. 15C shows the normalized frequency shift as a function of normalized temperature and predictions from Eqn. E4 with parameters α and $T_c$ taken from fits to $Q_i(T)$ above. Notably, the inventors find significant deviation from BCS theory for smaller thicknesses, which was previously observed for high-disorder films.

Controlling Nonlinearity in the Presence of Additional Losses

Figure 16A:
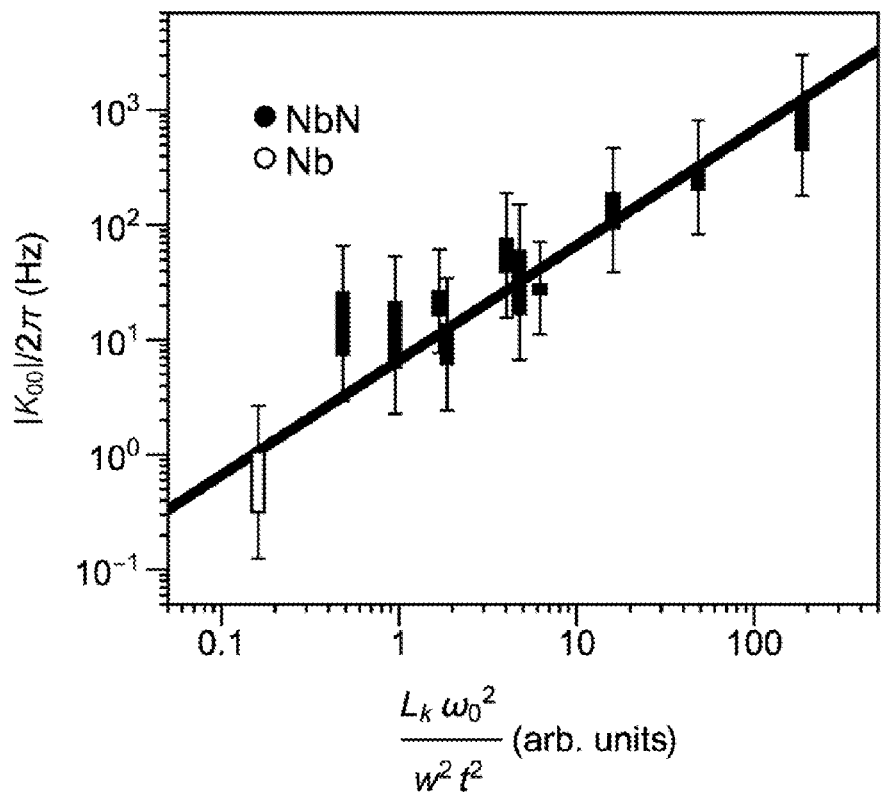
FIGS. 16A-16C illustrate self-Kerr-nonlinearity originating from kinetic inductance.
Figure 16B:
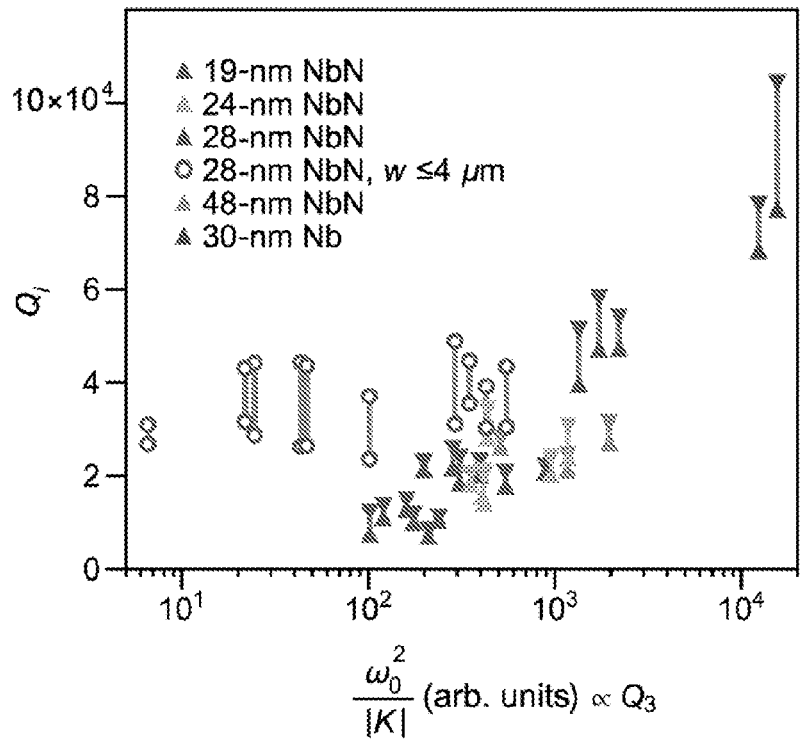
Figure 16C:
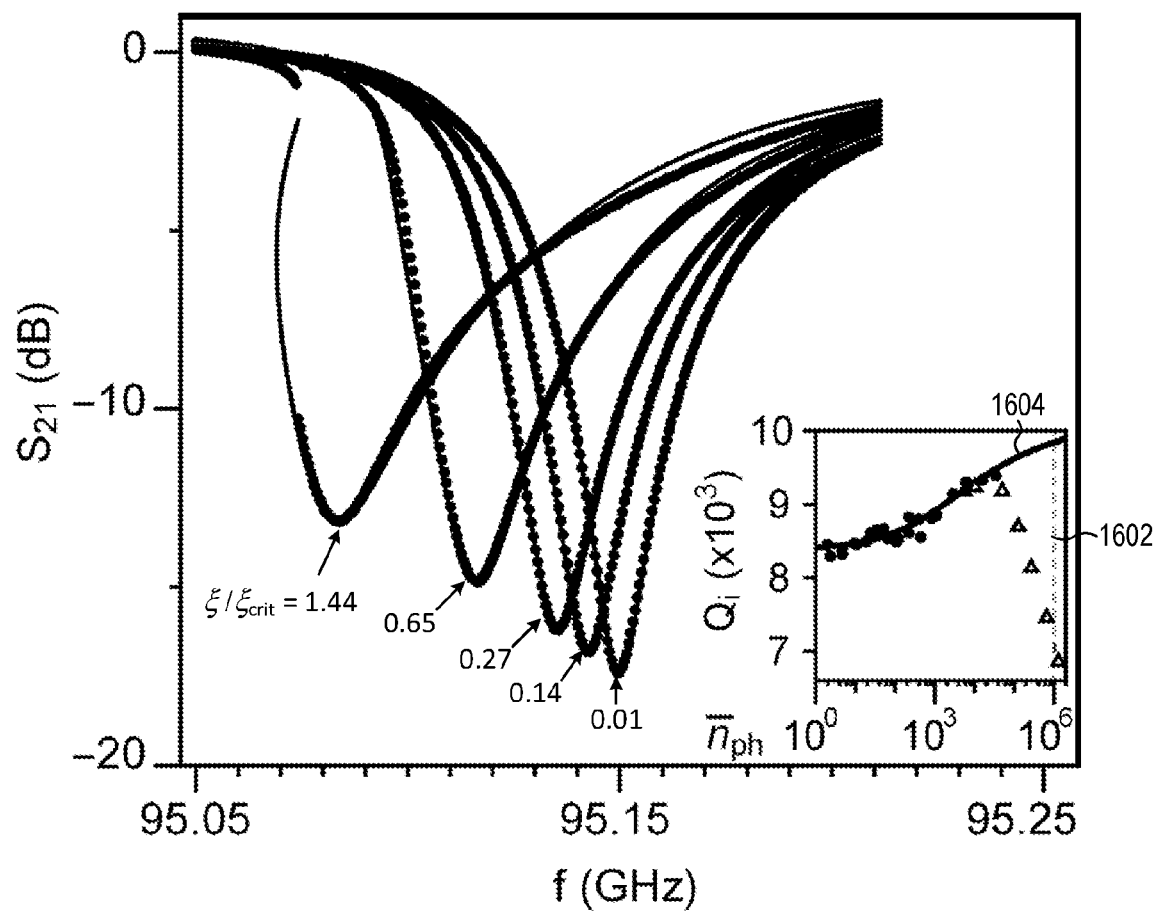

FIGS. 16A, 16B, and 16C illustrate self-Kerr-nonlinearity originating from kinetic inductance. Specifically, FIG. 16A is a plot of the self-Kerr-constant $|K_{00}|/2\pi$ (in Hz) as a function of $L_k \omega_0^2/(w^2 t^2)$ (in arbitrary units), with a linear fit overlaid as a solid line. In FIG. 16A, solid bars correspond to value ranges for groups of similar film thicknesses and wire widths, with error bars marking systematic uncertainty. FIG. 16B is a plot of $Q_i$ as a function of $\omega_0^2/|K_{00}|$ (in arbitrary units), which is proportional to a loss $Q_3$ associated with kinetic inductance. In FIG. 16B, points correspond to low-power and high-power limits of $Q_i$. Devices with differing wire width (shown as empty circles) do not appear to be correlated with $Q_3$. FIG. 16C is a plot of transmission $S_{21}$ (in dB) as a function of frequency f (in GHz) for an 18.7-nm-thick device at 95.15 GHz taken at increasing powers ξ (i.e., $\xi/\xi_{crit}$=0.01, 0.14, 0.27, 0.65, and 1.44). The inset of FIG. 16C highlights decreasing $Q_i$ near the bifurcation power $\xi_{crit}$ (see dashed line 1602) deviating from the two-level-system loss model (see solid line 1604). Triangles in the inset correspond to nonlinear model fits.

The inventors expect the self-Kerr-nonlinearity originating from kinetic inductance of a λ/4 resonator to be $$K = -\frac{\hbar\omega_0^2}{I_c^2}\int_0^l dx u_0^4 \Delta L \propto -\frac{\hbar\omega_0^2 L_k}{J_c^2 w^2 t^2}, \tag{F1}$$

where the nonlinear kinetic inductance ΔZ is constant along the transmission line, so integrating over the fundamental mode profile $u_0$ yields a constant. The inventors also transform the critical current $I_c$ was transformed into a critical current density $J_c$, and use the assumption that the nonlinear kinetic inductance is proportional to the linear kinetic inductance. FIG. 16A expands on FIG. 10B, showing measured self-Kerr-constants for all resonators in this study (grouped into points by film thickness and wire width) as a function of the parameters in Eqn. F1, with the solid line corresponding to a linear fit. The inventors also add data from identical resonators fabricated from 30-nm electron-beam-evaporated niobium to extend the parameter range. The inventors find reasonable agreement with dependence on the parameters in Eqn. F1. However, the dependence is much-less clear than that on wire width w.

Nonlinear kinetic inductance is also associated with a nonlinear resistance of the same form $R = R_0 + \Delta R I^2/I_c^2$. Assuming the nonlinear resistance scales with kinetic inductance, the losses associated with nonlinear resistance will be given by $$\gamma^3 = \frac{\omega_0}{Q_3} = \frac{3\hbar\omega_0}{8I_c^2}\int_0^l dx u_0^4 \Delta R \propto \frac{\hbar\omega_0 L_k}{J_c^2 w^2 t^2} \sim -\frac{K}{\omega_0} \tag{F2}$$

This indicates that upper bounds on nonlinear losses should scale as $Q_3 \sim \omega_0^3/|K|$. In FIG. 16B, the inventors plot low-power and high-power limits of the $Q_i$ devices in this study with the addition of the 30-nm niobium devices described above. The inventors find that for resonators with fixed wire widths w=4 µm, there appears to be a potential correlation of $Q_i$ with $Q_3$, indicating nonlinear resistance may be a potential loss mechanism.

The analysis does not account for higher harmonics of the resonator, which will be coupled to the fundamental mode by cross-Kerr-interactions $\chi_{mn}$, which for evenly spaced harmonics scale as $$\chi_{mn} = -\frac{3\hbar\omega_m\omega_n}{I_c^2}\int_0^l dx u_m^2 u_n^2 \Delta L \propto K. \qquad (F3)$$

Given the proportionality to K, the correlation described above may also potentially be a result of cross-Kerr-effects. For linewidths great enough to cover any deviations from evenly spaced higher harmonics, the inventors anticipate observing power-dependent conversion processes. In particular, for a Kerr nonlinear system with harmonics spaced at $\omega_0$ and $3\omega_0$, at powers approaching the critical power increased conversion efficiency from the fundamental to the third harmonic is expected, which in the present experiment would be observed as increased resonator loss at higher powers.

In FIG. 16C, we show the atypical transmission spectra of an 18.7-nm-thick, 4-µm-wide device with a particularly large linewidth showing decreasing $Q_i$ near the bifurcation power (above $n_{ph} \sim 10^5$), departing from the two-level system model described in the main text. This additional power-dependent loss may be the result of the nonlinear mechanisms described above, but may also be a result of circulating currents exceeding the thin-film critical current density, which is lowered by the increased London lengths of the thinner films. However, since the loss could also simply be a result of frequency-dependent dissipation, the source remains unclear.

In FIG. 16B, the inventors also observe that resonators achieving higher nonlinearities by reduction of the wire width do not appear to be affected by the nonlinear loss rate described above. The inventors also find that these devices do not show obvious signs of the high-power loss shown in FIG. 16C. While this may be a result of the difference in fabrication methods (see "Device Fabrication" above), the thinner wires may have higher vortex critical fields, leading to reduced vortex formation, and thus lower loss associated with vortex dissipation. Additionally, the thinner wires at the shorted end of the quarter-wave section of the resonator further shift the higher harmonics, potentially resulting in lower cross-Kerr-conversion loss.

Combinations of Features

Features described above as well as those claimed below may be combined in various ways without departing from the scope hereof. The following examples illustrate possible, non-limiting combinations of features and embodiments described above. It should be clear that other changes and modifications may be made to the present embodiments without departing from the spirit and scope of this invention:

(A1) A nonlinear parametric device may include a planar substrate and a resonator formed from superconductive material deposited on the planar substrate. The resonator may be sized to resonate at a millimeter-wave frequency. The resonator, when cooled below a critical temperature, exhibited nonlinear kinetic inductance.

(A2) In the device denoted (A1), the superconductive material may be one of niobium, aluminum, niobium nitride, titanium nitride, niobium titanium nitride, tantalum, and indium.

(A3) In either one of the devices denoted (A1) and (A2), the planar substrate may be fabricated from one of sapphire, quartz, crystalline silicon, and silicon-on-insulator.

(A4) In any one of the devices denoted (A1) through (A3), the superconductive material may form a single trace shaped as a shorted quarter-wave transmission line at the millimeter-wave frequency.

(A5) In the device denoted (A4), the shorted quarter-wave transmission line may be implemented as a balanced coplanar stripline waveguide.

(A6) In either one of the devices denoted (A4) and (A5), a width of the trace may be no greater than 200 µm.

(A7) In any one of the devices denoted (A4) through (A6), a thickness of the single trace may be no greater than 50 nm.

(A8) In any one of the devices denoted (A1) through (A7), an internal Q of a resonance of the resonator, when cooled below the critical temperature, may be at least 10,000.

(A9) In any one of the devices denoted (A1) through (A8), the superconductive material may be deposited on the planar substrate via atomic layer deposition.

(A10) In any one of the devices denoted (A1) through (A9), the device may further include an input waveguide abutting a first surface of the planar substrate such that one or more inputted millimeter waves, after propagating along the input waveguide, couple into the planar substrate through the first surface.

(A11) In the device denoted (A11), the resonator may be formed on the first surface of the planar substrate.

(A12) In any one of the devices denoted (A1) through (A11), the device may further include an output waveguide abutting a second surface of the planar substrate that is opposite to the first surface of the planar substrate, such that one or more outputted millimeter waves couple into the output waveguide through the second surface.

(A13) In any one of the devices denoted (A1) through (A12), the device may further include a second resonator formed from additional superconductive material deposited on the planar substrate. The second resonator may be sized to resonate at a second millimeter-wave frequency different than the millimeter-wave frequency.

(B1) A method for nonlinear frequency generation may include cooling a resonator below a critical temperature to exhibit nonlinear kinetic inductance. The resonator may be formed from superconductive material deposited on a planar substrate, and may be sized to resonate at a millimeter-wave frequency. The method may further include generating one or more outputted millimeter waves, via the nonlinear kinetic inductance, from one or more inputted millimeter waves coupled into the resonator.

(B2) In the method denoted (B1), the method may further include coupling the one or more inputted millimeter waves into the resonator, and coupling the one or more outputted millimeter waves out of the resonator.

(B3) In either one of the methods denoted (B1) and (B2), the one or more inputted millimeter waves may include a pump and a signal, the one or more outputted millimeter waves may include an amplified signal and an idler, and the generating may include parametrically amplifying the signal into the amplified signal by transferring energy from the pump into the signal and by emitting the idler.

(B4) In either of the methods denoted (B1) and (B2), the one or more inputted millimeter waves may include a first input at a first frequency $f_1$, a second input at a second frequency $f_2$ different from the first frequency, and a third input at a third frequency $f_3$ different from each of the first and second frequencies. The one or more outputted millimeter waves may include an output at an output frequency equal to at least one of $\pm f_1 \pm f_2 \pm f_3$. The generating may include four-wave mixing of the first, second, and third inputs to generate the output.

(B5) In either one of the methods denoted (B1) and (B2), the one or more inputted millimeter waves may include a first input at a first frequency $f_1$ and a second input at a second frequency $f_2$ different from the first frequency. The one or more outputted millimeter waves may include an output at an output frequency equal to $2f_1 - f_2$. The generating comprises may include degenerate four-wave mixing of the first and second inputs to generate the output.

(B6) In any one of the methods denoted (B2) through (B5), the coupling the one or more inputted millimeter waves may use an input waveguide abutting a first surface of the planar substrate such that the one or more inputted millimeter waves, after propagating along the input waveguide, couple into the planar substrate through the first surface.

(B7) In the method denoted (B6), the resonator may be formed on the first surface of the planar substrate.

(B8) In any one of the methods denoted (B2) through (B7), the coupling the one or more outputted millimeter waves may use an output waveguide abutting a second surface of the planar substrate that is opposite to the first surface of the planar substrate, such that the one or more outputted millimeter waves couple into the output waveguide through the second surface.

(B9) In any one of the methods denoted (B1) through (B8), the superconductive material may be one of niobium, aluminum, niobium nitride, titanium nitride, niobium titanium nitride, tantalum, and indium.

(B10) In any one of the methods denoted (B1) through (B9), the planar substrate may be fabricated from one of sapphire, quartz, crystalline silicon, and silicon-on-insulator.

(B11) In any one of the methods denoted (B1) through (B10), the superconductive material may form a single trace shaped as a shorted quarter-wave transmission line at the millimeter-wave frequency.

(B12) In the method denoted (B11), the shorted quarter-wave transmission line may be implemented as a balanced coplanar stripline waveguide.

(B13) In either one of the methods denoted (B11) and (B12), the width of the single trace may be no greater than 200 µm.

(B14) In any one of the methods denoted (B11) through (B13), a thickness of the single trace may be no greater than 50 nm.

(B15) In any one of the methods denoted (B1) through (B14), an internal Q of a resonance of the resonator may be at least 10,000.

(B16) In any one of the methods denoted (B1) through (B15), a second resonator may be formed from additional superconductive material deposited on the planar substrate. The second resonator may be sized to resonant at a second millimeter-wave frequency different than the millimeter-wave frequency. The cooling may include cooling the second resonator below a second critical temperature to exhibit nonlinear kinetic inductance. The method may further include generating, via the nonlinear kinetic inductance of the second resonator, one or more additional millimeter waves from the one or more inputted millimeter waves when the one or more inputted millimeter waves are coupled into the second resonator.

(B17) In the method denoted (B16), the method may further include simultaneously coupling the one or more inputted millimeter waves into both the resonator and the second resonator.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. A nonlinear parametric device comprising:
    a planar substrate; and
    a resonator formed from superconductive material deposited on the planar substrate, the resonator being sized to resonate at a millimeter-wave frequency;
    wherein the resonator, when cooled below a critical temperature, exhibits nonlinear kinetic inductance.

2. The nonlinear parametric device of claim 1, wherein the superconductive material is one of niobium, aluminum, niobium nitride, titanium nitride, niobium titanium nitride, tantalum, and indium.

3. The nonlinear parametric device of claim 1, wherein the planar substrate is fabricated from one of sapphire, quartz, crystalline silicon, and silicon-on-insulator.

4. The nonlinear parametric device of claim 1, wherein the superconductive material forms a single trace shaped as a shorted quarter-wave transmission line at the millimeter-wave frequency.

5. The nonlinear parametric device of claim 4, wherein the shorted quarter-wave transmission line is implemented as a balanced coplanar stripline waveguide.

6. The nonlinear parametric device of claim 1, further comprising an input waveguide abutting a first surface of the planar substrate such that one or more inputted millimeter waves, after propagating along the input waveguide, couple into the planar substrate through the first surface.

7. The nonlinear parametric device of claim 6, wherein:
    the resonator is formed on the first surface of the planar substrate; and
    the nonlinear parametric device further comprises an output waveguide abutting a second surface of the planar substrate, opposite to the first surface of the planar substrate, such that one or more outputted millimeter waves couple into the output waveguide through the second surface.

8. The nonlinear parametric device of claim 1, wherein an internal Q of a resonance of the resonator, when cooled below the critical temperature, is at least 10,000.

9. The nonlinear parametric device of claim 1, further comprising a second resonator formed from additional superconductive material deposited on the planar substrate, the second resonator being sized to resonate at a second millimeter-wave frequency different than the millimeter-wave frequency.

10. A method for nonlinear frequency generation, comprising:
    cooling a resonator below a critical temperature to exhibit nonlinear kinetic inductance, the resonator being formed from superconductive material deposited on a planar substrate, the resonator being sized to resonate at a millimeter-wave frequency; and generating one or more outputted millimeter waves, via the nonlinear kinetic inductance, from one or more inputted millimeter waves coupled into the resonator.

11. The method of claim 10, wherein:

a second resonator is formed from additional superconductive material deposited on the planar substrate, the second resonator being sized to resonate at a second millimeter-wave frequency different than the millimeter-wave frequency;

said cooling comprises cooling the second resonator below a second critical temperature to exhibit a second nonlinear kinetic inductance; and the method further comprises generating, via the second nonlinear kinetic inductance, one or more additional millimeter waves from the one or more inputted millimeter waves in response to the one or more inputted millimeter waves being coupled into the second resonator.

12. The method of claim 11, further comprising simultaneously coupling the one or more inputted millimeter waves into both the resonator and the second resonator.

13. The method of claim 10, wherein an internal Q of a resonance of the resonator is at least 10,000.

14. The method of claim 10, wherein the superconductive material forms a single trace shaped as a shorted quarter-wave transmission line at the millimeter-wave frequency.

15. The method of claim 10, further comprising:

coupling the one or more inputted millimeter waves into the resonator; and coupling the one or more outputted millimeter waves out of the resonator.

16. The method of claim 10, wherein:

the one or more inputted millimeter waves include a pump and a signal;

the one or more outputted millimeter waves include an amplified signal and an idler; and said generating the one or more outputted millimeter waves comprises parametrically amplifying the signal into the amplified signal by transferring energy from the pump into the signal and by emitting the idler.

17. The method of claim 10, wherein:

the one or more inputted millimeter waves include a first input wave at a first frequency $f_1$, a second input wave at a second frequency $f_2$ different from the first frequency, and a third input wave at a third frequency $f_3$ different from each of the first and second frequencies;

the one or more outputted millimeter waves include an output wave at an output frequency equal to at least one of $\pm f_1 \pm f_2 \pm f_3$; and said generating the one or more outputted millimeter waves comprises four-wave mixing of the first, second, and third input waves to generate the output wave.

18. The method of claim 10, wherein:

the one or more inputted millimeter waves include a first input wave at a first frequency $f_1$ and a second input wave at a second frequency $f_2$ different from the first frequency;

the one or more outputted millimeter waves include an output wave at an output frequency equal to $2f_1 - f_2$; and said generating the one or more outputted millimeter waves comprises degenerate four-wave mixing of the first and second input waves to generate the output wave.

19. The method of claim 10, further comprising:

coupling, with an input waveguide abutting a first surface of the planar substrate, the one or more inputted millimeter waves into the resonator via the first surface; and coupling the one or more outputted millimeter waves out of the resonator.

20. The method of claim 19, wherein:

the resonator is formed on the first surface of the planar substrate; and said coupling the one or more outputted millimeter waves uses an output waveguide abutting a second surface of the planar substrate that is opposite to the first surface of the planar substrate, such that the one or more outputted millimeter waves couple into the output waveguide through the second surface.

* * * * *